United States Patent
Si et al.

(10) Patent No.: US 9,608,642 B1
(45) Date of Patent: Mar. 28, 2017

(54) DELAY LOCK LOOP

(71) Applicant: VIA Alliance Semiconductor Co., Ltd., Shanghai (CN)

(72) Inventors: Qiang Si, Beijing (CN); Fan Jiang, Beijing (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/967,899

(22) Filed: Dec. 14, 2015

(30) Foreign Application Priority Data

Dec. 2, 2015 (CN) .......................... 2015 1 0875427

(51) Int. Cl.
H03L 7/08 (2006.01)
H03L 7/085 (2006.01)
H03K 5/134 (2014.01)
H03K 5/00 (2006.01)

(52) U.S. Cl.
CPC ............ H03L 7/085 (2013.01); H03K 5/134 (2014.07); *H03K 2005/00019* (2013.01)

(58) Field of Classification Search
CPC . H03L 7/08; H03L 7/085; H03L 7/087; H03L 7/0812; H03L 7/16; H03L 7/18; H03K 5/134; H03K 5/135; H03K 5/14; H03K 5/01; H03K 5/04; H03K 5/13
USPC ................................ 327/147, 156, 158, 161
See application file for complete search history.

(56) References Cited

U.S. PATENT DOCUMENTS 6,140,854 A * 10/2000 Coddington .............. G06F 1/10
327/149
2016/0149563 A1* 5/2016 Kim ....................... H03K 5/135
327/158

* cited by examiner

*Primary Examiner* — John Poos
(74) *Attorney, Agent, or Firm* — McClure, Qualey & Rodack, LLP

(57) ABSTRACT

A delay lock loop including a selection unit, a delay unit, and a phase detection unit is provided. The selection unit receives a non-inverted clock signal and an inverted clock signal and generates a first clock signal and a second clock signal according to an indication signal. The delay unit is coupled to the selection unit. The delay unit includes a delay factor and delays the first clock signal to generate a third clock signal according to the delay factor. The phase detection unit is coupled to the delay unit and the selection unit and generates the indication signal according to a phase difference between the second and third clock signals. The delay unit adjusts the delay factor according to the indication signal.

8 Claims, 22 Drawing Sheets

DELAY LOCK LOOP

CROSS REFERENCE TO RELATED APPLICATIONS

This Application claims priority of China Patent Application No. 201510875427.0, filed on Dec. 2, 2015, the entirety of which is incorporated by reference herein.

BACKGROUND OF THE INVENTION

Field of the Invention

The invention relates to an electronic circuit, and more particularly to a delay lock loop.

Description of the Related Art

As technological developments have progressed, the number of circuits integrated into a single integrated circuit (IC) have increased. Each of circuits integrated into a single IC operates according to a clock signal. However, the clock signal is easily affected by the manufacturing process or temperature. When the clock signal is shifted, the IC cannot work normally.

BRIEF SUMMARY OF THE INVENTION

In accordance with an embodiment, a delay lock loop comprises a selection unit, a delay unit, and a phase detection unit. The selection unit receives a non-inverted clock signal and an inverted clock signal and generates a first clock signal and a second clock signal according to an indication signal. The delay unit is coupled to the selection unit. The delay unit comprises a delay factor and delays the first clock signal to generate a third clock signal according to the delay factor. The phase detection unit is coupled to the delay unit and the selection unit and generates the indication signal according to a phase difference between the second and third clock signals. The delay unit adjusts the delay factor according to the indication signal.

The delay lock loop of the invention eliminates an initial delay of the delay unit to provide a perfect delay purpose, wherein the delay unit is not capable of eliminating the initial delay. Compare to a conventional delay lock loop, the elements utilized by the delay lock loop of the invention is less than the elements utilized by the conventional delay lock loop. Therefore, the usable space in the delay lock loop of the invention is increased and the consumption of the delay lock loop of the invention is reduced.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
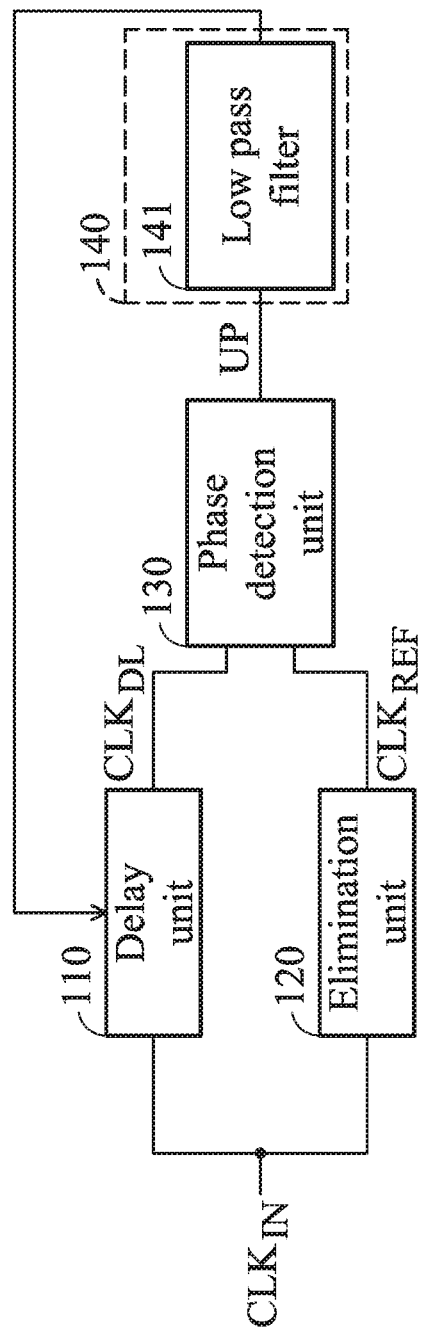
FIGS. 1A~1B are schematic diagrams of exemplary embodiments of a delay lock loop, according to various aspects of the present disclosure.

FIG. 1A is a schematic diagram of an exemplary embodiment of a delay lock loop, according to various aspects of the present disclosure. The delay lock loop 100A comprises a delay unit 110, an elimination unit 120, a phase detection unit 130 and a control unit 140. The delay unit 110 has a delay factor and delays a first clock signal to generate a second clock signal according to the delay factor. In this embodiment, the delay unit 110 delays an input clock signal $CLK_{IN}$ to generate a clock signal $CLK_{DL}$. The invention does not limit the internal circuit structure of the delay unit 110. Any circuit can serve as a delay unit 110, as long as the circuit is capable of comprising a programmable delay property.

The time difference between the clock signal $CLK_{DL}$ and the input clock signal $CLK_{IN}$ is defined by the delay factor of the delay unit 110. For example, when the delay factor is large, the time difference between the clock signal $CLK_{DL}$ and the input clock signal $CLK_{IN}$ is large. Conversely, when the delay factor is small, the time difference between the clock signal $CLK_{DL}$ and the input clock signal $CLK_{IN}$ is small. Theoretically, when the delay factor is a minimum value, such as 0, the time difference between the clock signal $CLK_{DL}$ and the input clock signal $CLK_{IN}$ should be zero. In fact, when the delay factor is the minimum value, such as 0, an initial time difference (e.g. 200 picoseconds) occurs between the clock signal $CLK_{DL}$ and the input clock signal $CLK_{IN}$.

To eliminate the initial time difference caused by the delay unit 110, the elimination unit 120 delays a third clock signal to generate a fourth clock signal. In this embodiment, the elimination unit 120 delays the input clock signal $CLK_{IN}$ to generate the clock signal $CLK_{REF}$. The time difference between the input clock signal $CLK_{IN}$ and the clock signal $CLK_{REF}$ is kept equal to the initial time difference. The invention does not limit the internal circuit structure of the elimination unit 120. Any circuit can serve as an elimination unit 120, as long as the circuit is capable of providing a fixed time difference between the input clock signal $CLK_{IN}$ and the clock signal $CLK_{REF}$.

The phase detection unit 130 generates an indication signal UP according to the phase difference between the clock signals $CLK_{DL}$ and $CLK_{REF}$. In one embodiment, when the rising edge of the clock signal $CLK_{DL}$ leads the rising edge of the clock signal $CLK_{REF}$, the indication signal UP is at a first level, such as a high level. When the rising edge of the clock signal $CLK_{DL}$ follows the rising edge of the clock signal $CLK_{REF}$, the indication signal UP is at a second level, such as a low level. In other embodiments, the phase detection unit 130 compares the falling edge of the clock signal $CLK_{DL}$ with the rising edge of the clock signal $CLK_{REF}$. In some embodiments, the initial pre-determined level indication signal UP is the first level.

The control unit 140 adjusts the delay factor of the delay unit 110 according to the indication signal UP. For example, when the indication signal UP is at the first level, the control unit 140 increases the delay factor of the delay unit 110. When the indication signal UP is at the second level, the control unit 140 reduces the delay factor of the delay unit 110. In this embodiment, the control unit 140 is a low pass filter (LPF) 141, but the disclosure is not limited thereto. In other embodiments, any circuit can serve as a control unit 140, as long as the circuit is capable of according to an indication signal to adjust the delay factor of the delay unit 110.

Figure 1B:
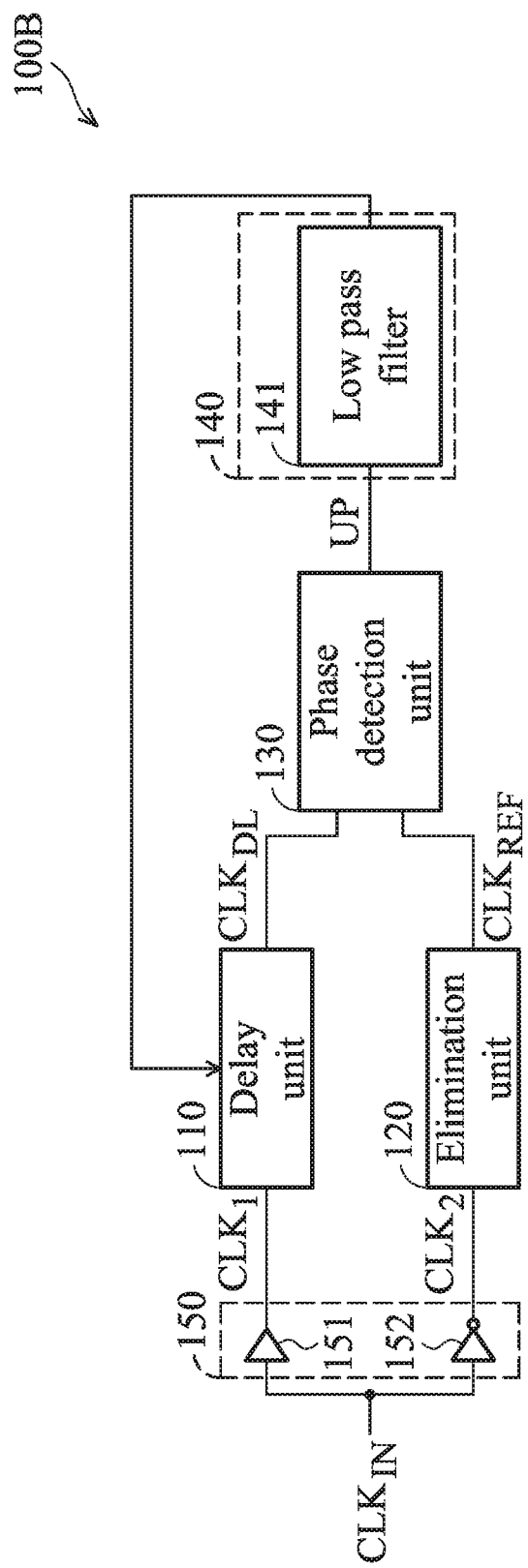

FIG. 1B is a schematic diagram of another exemplary embodiment of the delay lock loop, according to various aspects of the present disclosure. FIG. 1B is similar to FIG. 1A exception that the delay lock loop 100B further comprises a buffer unit 150. The buffer unit 150 comprises a buffer 151 and an inverter 152. The buffer 151 processes the input clock signal $CLK_{IN}$ to generate a buffer clock signal $CLK_1$. The delay unit 110 delays the buffer clock signal $CLK_1$ to generate the clock signal $CLK_{DL}$. In one embodiment, the buffer clock signal $CLK_1$ is referred to as a non-inverted clock signal. Furthermore, the inverter 152 inverts the input clock signal $CLK_{IN}$ to generate a buffer clock signal $CLK_2$. The elimination unit 120 delays the buffer clock signal $CLK_2$ to generate the clock signal $CLK_{REF}$. In one embodiment, the buffer clock signal $CLK_2$ is referred to as a inverted clock signal.

In this embodiment, when the rising edge of the clock signal $CLK_{DL}$ leads the falling edge of the clock signal $CLK_{REF}$, the indication signal UP is at the first level. Therefore, the control unit 140 increases the delay factor of the delay unit 110. When the rising edge of the clock signal $CLK_{DL}$ follows the falling edge of the clock signal $CLK_{REF}$, the indication signal UP is at the second level. Therefore, the control unit 140 reduces the delay factor of the delay unit 110.

In another embodiment, when the delay lock loop 100A or 100B shown in FIG. 1A or FIG. 1B is initiated, the delay factor is reset to a minimum value, such as 0. At this time, if the phase detection unit 130 determines that the rising edge of the clock signal $CLK_{DL}$ leads the rising edge of the clock signal $CLK_{REF}$, it means that the delay time by which the delay unit 110 delays the input clock signal $CLK_{IN}$ (or $CLK_1$) is shorter than the delay time by which the elimination unit 120 delays the input clock signal $CLK_{IN}$ (or $CLK_2$). Therefore, the delay factor of the delay unit 110 should be increased such that the delay time by which the delay unit 110 delays the input clock signal $CLK_{IN}$ (or $CLK_1$) is equal to the delay time by which the elimination unit 120 delays the input clock signal $CLK_{IN}$ (or $CLK_2$). The initial delay of the delay unit 110 can be eliminated. At this time, the indication signal UP generated by the phase detection unit 130 is at a first level, such as 1. The control unit 130 increases the delay factor of the delay unit 110 to increase the delay time by which the delay unit 110 delays the input clock signal $CLK_{IN}$ (or $CLK_1$) until the phase detection unit 130 determines that the rising edge of the clock signal $CLK_{DL}$ synchronizes the rising edge of the clock signal $CLK_{REF}$. When the rising edge of the clock signal $CLK_{DL}$ synchronizes the rising edge of the clock signal $CLK_{REF}$, the indication signal UP is at a second level, such as 0. Therefore, the delay time by which the delay unit 110 delays the input clock signal $CLK_{IN}$ (or $CLK_1$) is equal to the delay time by which the elimination unit 120 delays the input clock signal $CLK_{IN}$ (or $CLK_2$) such that the initial delay of the delay unit 110 is eliminated and the initialization of the delay lock loop 100A or 100B is finished. In another embodiment, when the delay lock loop 100A or 100B is initiated, the delay factor of the delay unit 110 is reset to a minimum value, such as 0. If the phase detection unit 130 determines that the rising edge of the clock signal $CLK_{DL}$ follows the rising edge of the clock signal $CLK_{REF}$, it means that the delay time by which the delay unit 110 delays the input clock signal $CLK_{IN}$ (or $CLK_1$) is longer than the delay time by which the elimination unit 120 delays the input clock signal $CLK_{IN}$ (or $CLK_2$). Therefore, the delay factor of the delay unit 110 should be reduced such that the delay time by which the delay unit 110 delays the input clock signal $CLK_{IN}$ (or $CLK_1$) is equal to the delay time by which the elimination unit 120 delays the input clock signal $CLK_{IN}$ (or $CLK_2$) to eliminate the initial delay of the delay unit 110. However, since the delay factor of the delay unit 110 is a minimum value which cannot be reduced, the delay factor of the delay unit 110 is increased such that the rising edge of the clock signal $CLK_{DL}$ synchronizes the rising edge of the clock signal $CLK_{REF}$ in the next cycle. Therefore, the indication signal UP generated by the phase detection unit 130 is still at the first level, such as 1. The control unit 140 increases the delay factor of the delay unit 110 according to the indication signal UP. The delay time by which the delay unit 110 delays the input clock signal $CLK_{IN}$ (or $CLK_1$) is increased until the phase detection unit 130 determines that the rising edge of the clock signal $CLK_{DL}$ synchronizes the rising edge of the clock signal $CLK_{REF}$. When the rising edge of the clock signal $CLK_{DL}$ synchronizes the rising edge of the clock signal $CLK_{REF}$, the indication signal UP is changed to the second level, such as 0. At this time, the delay time by which the delay unit 110 delays the input clock signal $CLK_{IN}$ (or $CLK_1$) is equal to the delay time by which the elimination unit 120 delays the input clock signal $CLK_{IN}$ (or $CLK_2$) to eliminate the initial delay of the delay unit 110. The initialization of the delay lock loop 100A or 100B is finished. In other words, even if the rising edge of the clock signal $CLK_{DL}$ follows or leads the rising edge of the clock signal $CLK_{REF}$, the phase detection unit 130 generates the indication signal UP with the first level, such as 1. Therefore, the delay unit 110 continually delays the clock signal $CLK_1$ until the rising edge of the clock signal $CLK_{DL}$ synchronizes the rising edge of the clock signal $CLK_{REF}$. At this time, the phase detection unit 130 changes the indication signal UP from the first level to the second level, such as 0.

Figure 2A:
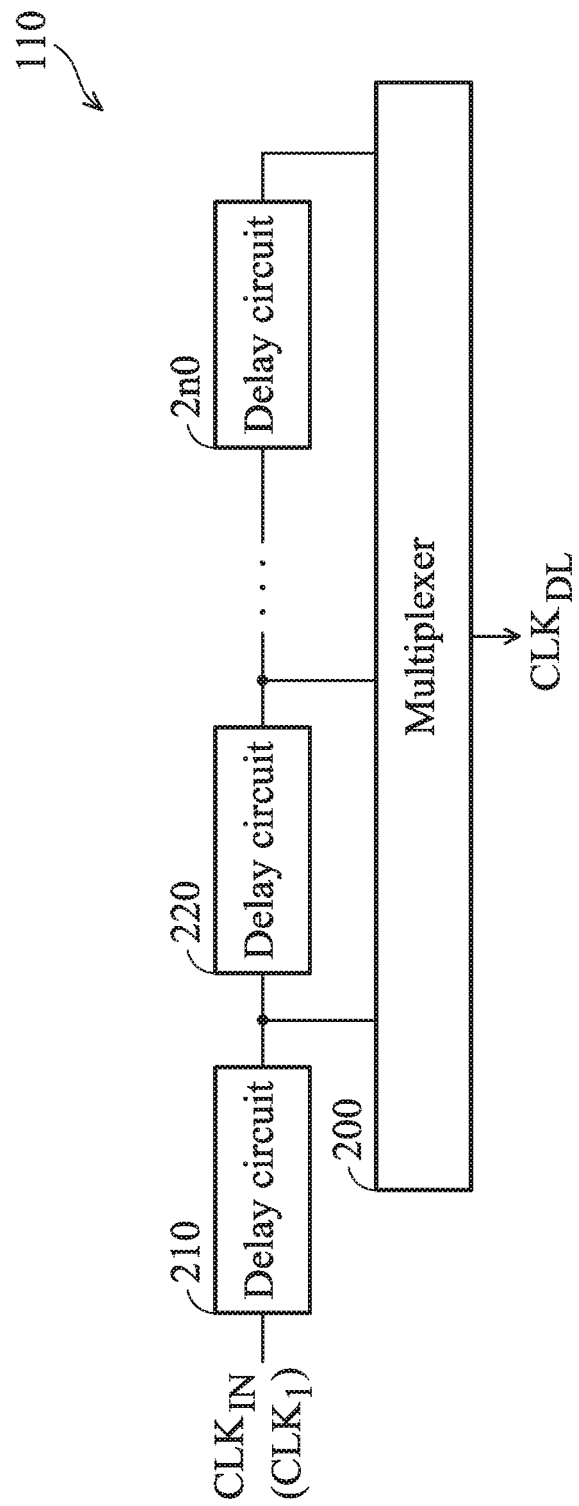
FIG. 2A is a schematic diagram of an exemplary embodiment of a delay unit, according to various aspects of the present disclosure.

FIG. 2A is a schematic diagram of an exemplary embodiment of a delay unit, according to various aspects of the present disclosure. The delay unit 110 comprises delay circuits 210~2n0 and a multiplexer 200. The delay circuits 210~2n0 are connected in series with one another. Each delay circuit delays the output of the previous delay circuit to generate a delayed signal to the next delay circuit. In this embodiment, the first delay circuit 210 delays the input clock signal $CLK_{IN}$ shown in FIG. 1A or the clock signal $CLK_1$ shown in FIG. 1B and provides a delayed signal to the delay circuit 220.

The invention does not limit the internal circuit structure of each of the delay circuits 210~2n0. In one embodiment, each of the delay circuits 210~2n0 is the same as the delay circuit 210 shown in FIG. 2C. In this embodiment, the multiplexer 200 selects and outputs the corresponding delayed signal according to the delay factor. The output signal of the multiplexer 200 serves as the clock signal $CLK_{DL}$. For example, when the delay factor is a minimum value (e.g. 0), the multiplexer 200 selects the delayed signal generated by the delay circuit 210. When the delay factor is a maximum value, the multiplexer 200 selects the delayed signal generated by the delay circuit 2n0.

Figure 2B:
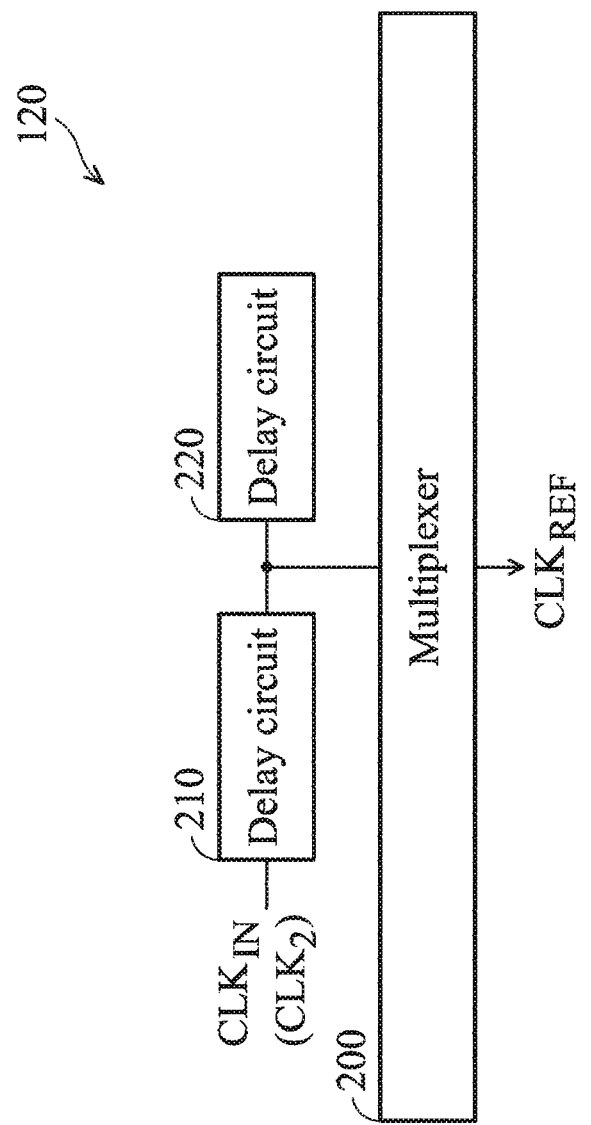
FIG. 2B is a schematic diagram of another exemplary embodiment of a delay unit, according to various aspects of the present disclosure.

FIG. 2B is a schematic diagram of an exemplary embodiment of an elimination unit, according to various aspects of the present disclosure. The elimination unit 120 comprises delay circuits 210 and 220 and a multiplexer 200. In one embodiment, the internal structure of each of the delay circuits 210 and 220 shown in FIG. 2B is the same as the delay circuit 210 shown in FIG. 2C. The structure of the multiplexer 200 shown in FIG. 2B is the same as the structure of the multiplexer 200 shown in FIG. 2A. The delay circuit 210 delays the input clock signal $CLK_{IN}$ shown in FIG. 1A or the clock signal $CLK_2$ shown in FIG. 1B and provides the delayed signal to the multiplexer 200. The delay circuit 220 outputs the clock signal $CLK_{REF}$. In FIGS. 2A and 2B, the structure of the elimination unit 120 is the same as the delay unit 110 whose delay factor is a minimum value. In other words, only the delay circuit 210 delays the signal and the multiplexer 200 outputs the delayed signal. In this embodiment, the delay circuit 220 is connected to the delay circuit 210 in series. The delay circuit 220 and the multiplexer 200 serve as the load of the delay circuit 210 to measure that the delay time by which the delay circuit 210 shown in FIG. 2B delays the input clock signal $CLK_{IN}$ (or $CLK_2$) is equal to the delay time by which the delay circuit 210 shown in FIG. 2A delays the input clock signal $CLK_{IN}$ (or $CLK_1$).

Figure 2C:
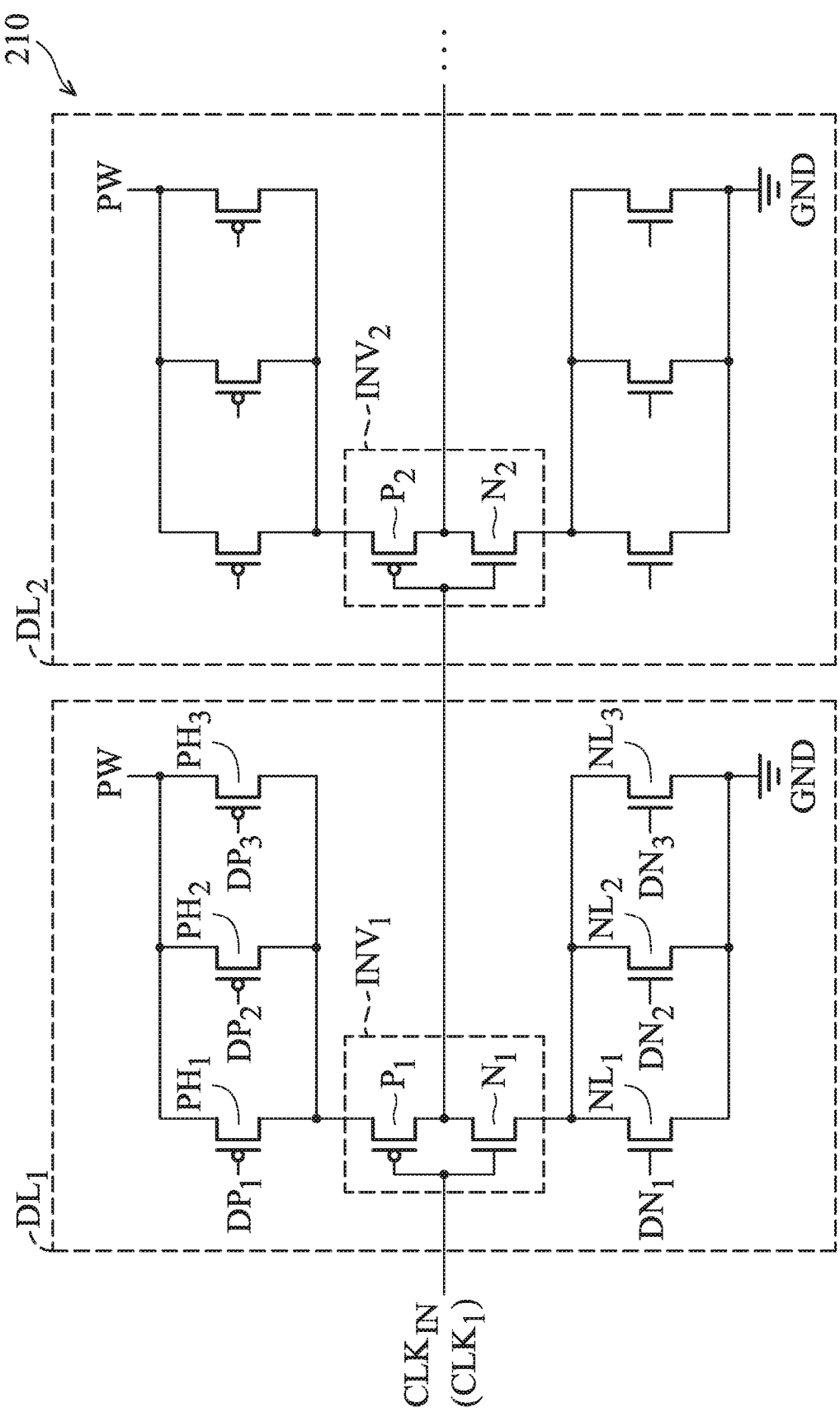
FIG. 2C is a schematic diagram of an exemplary embodiment of an elimination unit, according to various aspects of the present disclosure.

FIG. 2C is a schematic diagram of an exemplary embodiment of a delay circuit, according to various aspects of the present disclosure. The delay unit 110 comprises a plurality of delay circuits 210. The delay circuits are connected in series with one another. For clarity, a single delay circuit 210 is shown in FIG. 2C. The delay circuit 210 comprises delay cells $DL_1$~$DL_2$, but the disclosure is not limited thereto. In some embodiments, the delay circuit 210 may comprise any suitable number of delay cells. Since the operations of the delay cells $DL_1$ and $DL_2$ are the same, the delay cell $DL_1$ is provided as an example.

The delay cell $DL_1$ comprises a P-type transistor $P_1$, a N-type transistor $N_1$, a plurality of pull-high transistors and a plurality of pull-low transistors. For clarity, FIG. 2C only shows the pull-high transistors $PH_1$~$PH_3$ and the pull-low transistors $NL_1$~$NL_3$. The pull-high transistors $PH_1$~$PH_3$ are connected in parallel with one another. The drains of the pull-high transistors $PH_1$~$PH_3$ are coupled to the source of the P-type transistor $P_1$. The sources of the pull-high transistors $PH_1$~$PH_3$ are coupled to a voltage source PW. The gates of the pull-high transistors $PH_1$~$PH_3$ receive control signals $DP_1$~$DP_3$, respectively. In this embodiment, the control signals $DP_1$~$DP_3$ are related to the delay factor of the delay unit 110. In one embodiment, the delay circuit 210 further comprises an encoder (not shown). The encoder generates the control signals $DP_1$~$DP_3$ according to a delay factor to turn on or turn off the pull-high transistors $PH_1$~$PH_3$. When the delay factor is a minimum value (e.g. 0), the pull-high transistors $PH_1$~$PH_3$ are turned on. When the delay factor is a maximum value, one of the pull-high transistors $PH_1$~$PH_3$ is turned and the others are turned off.

The pull-low transistors $NL_1$~$NL_3$ are connected in parallel with one another. The drains of the pull-low transistors $NL_1$~$NL_3$ are coupled to the source of the N-type transistor $N_1$. The sources of the pull-low transistors $NL_1$~$NL_3$ receive ground voltage GND. The gates of the pull-low transistors $NL_1$~$NL_3$ receives control signals $DN_1$~$DN_3$, respectively. In this embodiment, the control signals $DN_1$~$DN_3$ are opposite to the control signals $DP_1$~$DP_3$. Therefore, the number of turned-on pull-high transistors is equal to the number of turned-on pull-low transistors. For example, when the control signals $DP_1$~$DP_3$ are 001, the control signals $DN_1$~$DN_3$ are 110. At this time, the pull-high transistors $PH_1$~$PH_2$ and the pull-low transistors $NL_1$~$NL_2$ are turned on. In this embodiment, the delay cells $DL_1$ and $DL_2$ are inverters to delay the input clock signal $CLK_{IN}$ shown in FIG. 1A or the clock signal $CLK_1$ shown in FIG. 1B. The control signals $DN_1$~$DN_3$ and $DP_1$~$DP_3$ are utilized to adjust the delay time by which the delay circuit 210 delays the input clock signal $CLK_{IN}$ shown in FIG. 1A or the clock signal $CLK_1$ shown in FIG. 1B.

In this embodiment, the P-type transistor $P_1$ is connected to the N-type transistor $N_1$ in series to constitute an inverter $INV_1$. The input of the inverter $INV_1$ can receive the input clock signal $CLK_{IN}$ shown in FIG. 1A or the clock signal $CLK_1$ shown in FIG. 1B. In this embodiment, the P-type transistor $P_2$ and the N-type transistor $N_2$ of the delay circuit $DL_2$ constitute another inverter $INV_2$. The input of the inverter $INV_2$ is coupled to the output of the inverter $INV_1$. The output of the inverter $INV_2$ outputs the clock signal $CLK_{DL}$.

In this embodiment, when the level of the input clock signal $CLK_{IN}$ shown in FIG. 1A or the clock signal $CLK_1$ shown in FIG. 1B is 0, the P-type transistor $P_1$ is turned on and the N-type transistor $N_1$ is turned off. The pull-high transistors $PH_1$~$PH_3$ are turned on or off according to the control signals $DP_1$~$DP_3$. The number of turned-on pull-high transistors define the time point at which the P-type transistor $P_1$ outputs a high level. When the level of the input clock signal $CLK_{IN}$ shown in FIG. 1A or the clock signal $CLK_1$ shown in FIG. 1B is 1, the P-type transistor $P_1$ is turned off and the N-type transistor $N_1$ is turned on. The pull-low transistors $NL_1$~$NL_3$ are turned on or off according to the control signals $DN_1$~$DN_3$. The number of turned-on pull-low transistors define the time point at which the N-type transistor $N_1$ outputs a low level. When the delay factor of the delay unit 110 is equal to 0, the control signals $DP_1$~$DP_3$ are 000 and the control signals $DN_1$~$DN_3$ are 111.

Figure 3A:
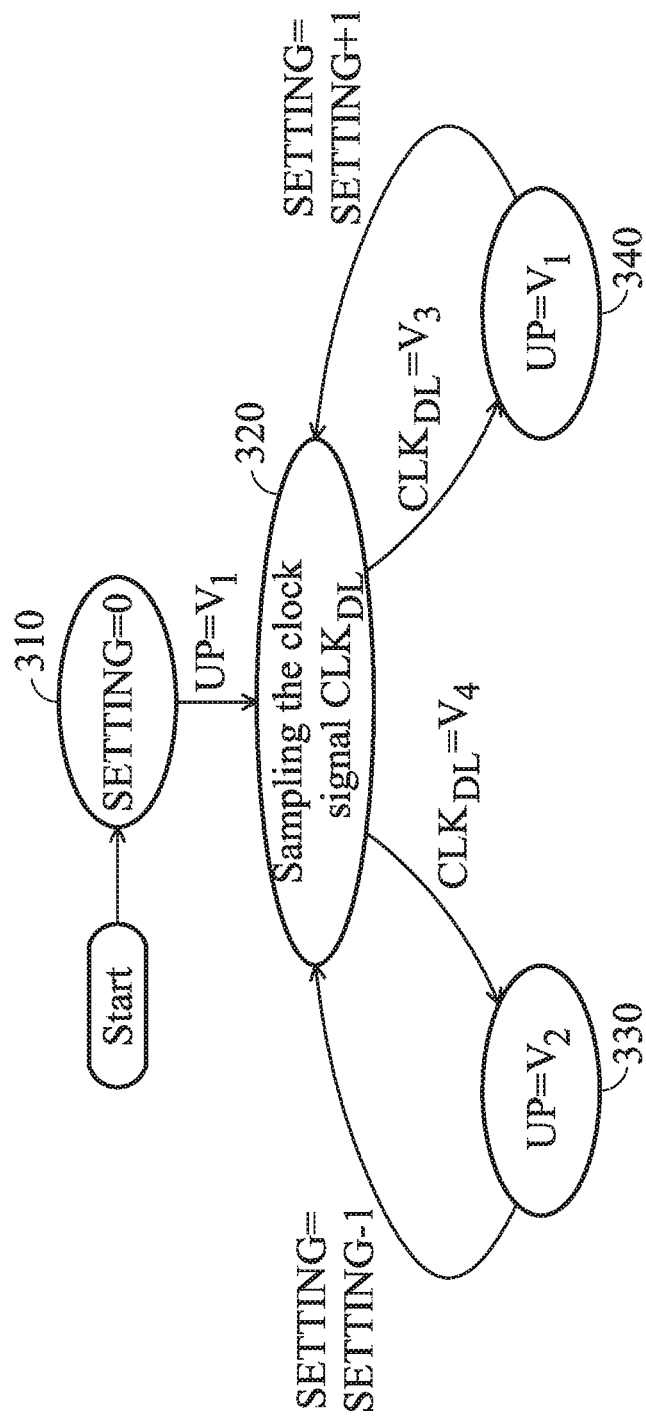
FIG. 3A is a state schematic diagram of an exemplary embodiment of the delay lock loop shown in FIG. 1B, according to various aspects of the present disclosure.

FIG. 3A is a state schematic diagram of an exemplary embodiment of the delay lock loop 100B shown in FIG. 1B, according to various aspects of the present disclosure. First, in state 310, the delay lock loop 100B is initiated. The delay factor SETTING of the delay unit 110 is reset to an initial value. In one embodiment, the level of the indication signal UP is a pre-determined level, such as a level $V_1$. In state 320, the phase detection unit 130 samples the clock signal $CLK_{DL}$ according to the clock signal $CLK_{REF}$. In one embodiment, the phase detection unit 130 determines the level of the clock signal $CLK_{DL}$.

When the rising edge of the clock signal $CLK_{REF}$ corresponds to a level of the clock signal $CLK_{DL}$ and the level of the clock signal $CLK_{DL}$ is a level $V_4$, the level of the indication signal UP is set to a level $V_2$. Therefore, the control unit 140 reduces the delay factor SETTING of the delay unit 110 and state 320 is entered. When the rising edge of the clock signal $CLK_{REF}$ corresponds to a level of the clock signal $CLK_{DL}$ and the level of the clock signal $CLK_{DL}$ is a level $V_3$, the level of the indication signal UP is maintained at the level $V_1$. Therefore, the control unit 140 increases the delay factor SETTING of the delay unit 110. The delay unit 110 delays the clock signal $CLK_{DL}$ according to the increased delay factor SETTING and state 320 is entered.

In another embodiment, when the delay lock loop 100A or 100B shown in FIG. 1A or FIG. 1B is initiated, the delay factor is reset to a minimum value, such as 0. At this time, if the phase detection unit 130 determines that the rising edge of the clock signal $CLK_{DL}$ leads the rising edge of the clock signal $CLK_{REF}$, it means that the delay time by which the delay unit 110 delays the input clock signal $CLK_{IN}$ (or $CLK_1$) is shorter than the delay time by which the elimination unit 120 delays the input clock signal $CLK_{IN}$ (or $CLK_2$). Therefore, the delay factor of the delay unit 110 should be increased such that the delay time by which the delay unit 110 delays the input clock signal $CLK_{IN}$ (or $CLK_1$) is equal to the delay time by which the elimination unit 120 delays the input clock signal $CLK_{IN}$ (or $CLK_2$) to eliminate the initial delay of the delay unit 110. At this time, the indication signal UP generated by the phase detection unit 130 is at a first level, such as 1. The control unit 130 increases the delay factor of the delay unit 110 according to the indication signal UP. Therefore, the delay time by which the delay unit 110 delays the input clock signal $CLK_{IN}$ (or $CLK_1$) is increased until the phase detection unit 130 determines that the rising edge of the clock signal $CLK_{DL}$ synchronizes the rising edge of the clock signal $CLK_{REF}$. When the rising edge of the clock signal $CLK_{DL}$ synchronizes the rising edge of the clock signal $CLK_{REF}$, the indication signal UP is at a second level, such as 0. Therefore, the delay time by which the delay unit 110 delays the input clock signal $CLK_{IN}$ (or $CLK_1$) is equal to the delay time by which the elimination unit 120 delays the input clock signal $CLK_{IN}$ (or $CLK_2$) such that the initial delay of the delay unit 110 is eliminated and the initialization of the delay lock loop 100A or 100B is finished. In another embodiment, when the delay lock loop 100A or 100B is initiated, the delay factor of the delay unit 110 is reset to a minimum value, such as 0. If the phase detection unit 130 determines that the rising edge of the clock signal $CLK_{DL}$ follows the rising edge of the clock signal $CLK_{REF}$, it means that the delay time by which the delay unit 110 delays the input clock signal $CLK_{IN}$ (or $CLK_1$) is longer than the delay time by which the elimination unit 120 delays the input clock signal $CLK_{IN}$ (or $CLK_2$). Therefore, the delay factor of the delay unit 110 should be reduced such that the delay time by which the delay unit 110 delays the input clock signal $CLK_{IN}$ (or $CLK_1$) is equal to the delay time by which the elimination unit 120 delays the input clock signal $CLK_{IN}$ (or $CLK_2$) to eliminate the initial delay of the delay unit 110. However, since the delay factor of the delay unit 110 is a minimum value which cannot be reduced, the delay factor of the delay unit 110 is increased such that the rising edge of the clock signal $CLK_{DL}$ synchronizes the rising edge of the clock signal $CLK_{REF}$ in the next cycle. Therefore, the indication signal UP generated by the phase detection unit 130 is still at the first level, such as 1. The control unit 140 increases the delay factor of the delay unit 110 according to the indication signal UP. The delay time by which the delay unit 110 delays the input clock signal $CLK_{IN}$ (or $CLK_1$) is increased until the phase detection unit 130 determines that the rising edge of the clock signal $CLK_{DL}$ synchronizes the rising edge of the clock signal $CLK_{REF}$. When the rising edge of the clock signal $CLK_{DL}$ synchronizes the rising edge of the clock signal $CLK_{REF}$, the indication signal UP is changed to the second level, such as 0. At this time, the delay time by which the delay unit 110 delays the input clock signal $CLK_{IN}$ (or $CLK_1$) is equal to the delay time by which the elimination unit 120 delays the input clock signal $CLK_{IN}$ (or $CLK_2$) to eliminate the initial delay of the delay unit 110. The initialization of the delay lock loop 100A or 100B is finished. In other words, even if the rising edge of the clock signal $CLK_{DL}$ follows or leads the rising edge of the clock signal $CLK_{REF}$, the phase detection unit 130 generates the indication signal UP with the first level, such as 1. Therefore, the delay unit 110 continually delays the clock signal $CLK_1$ until the rising edge of the clock signal $CLK_{DL}$ synchronizes the rising edge of the clock signal $CLK_{REF}$. At this time, the phase detection unit 130 changes the indication signal UP from the first level to the second level, such as 0.

Figure 3B:
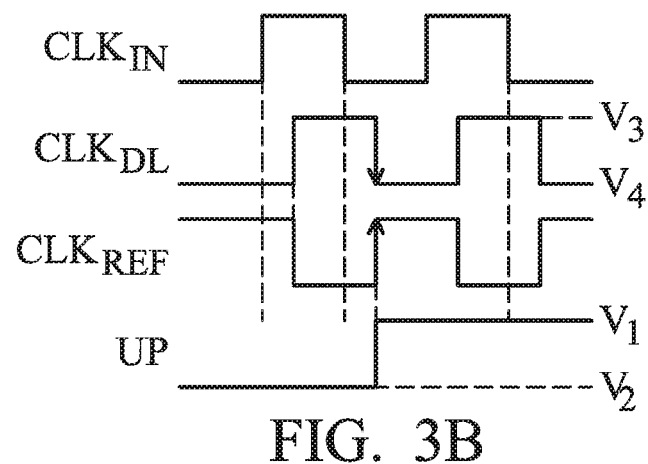
FIGS. 3B~3D are clock schematic diagrams of exemplary embodiments of the delay lock loop shown in FIG. 1B, according to various aspects of the present disclosure.
Figure 3C:
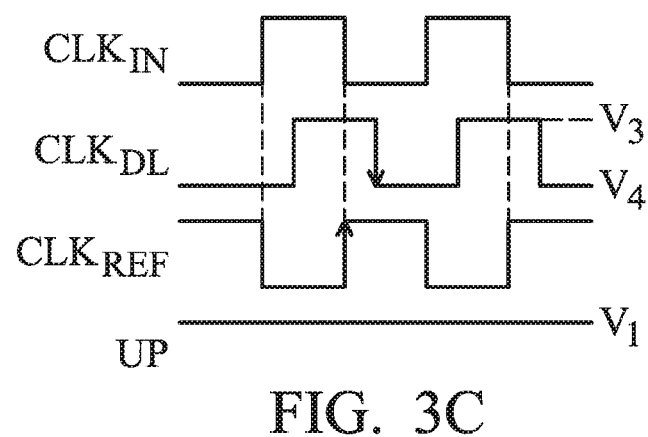
Figure 3D:
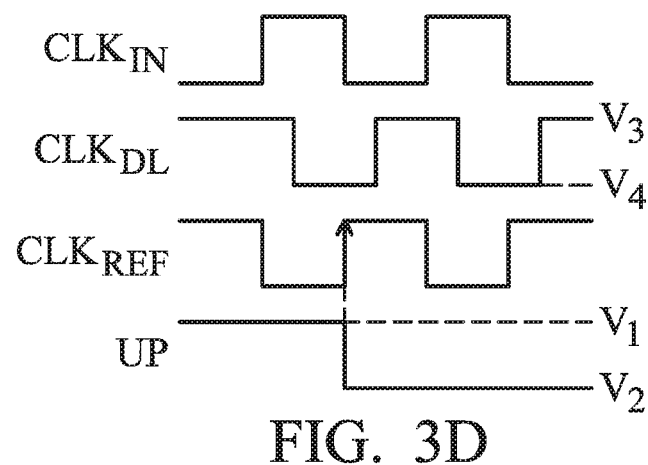

FIGS. 3B~3D are clock schematic diagrams of exemplary embodiments of the delay lock loop of FIG. 1B, according to various aspects of the present disclosure. In FIG. 3B, assuming that the first falling edge of the clock signal $CLK_{DL}$ is aligned with the rising edge of the clock signal $CLK_{REF}$. At this time, the indication signal UP is at an initial level, such as the level $V_1$. Therefore, the control unit 140 increases the delay factor SETTING so that the falling edge of the clock signal $CLK_{DL}$ follows the rising edge of the clock signal $CLK_{REF}$, as shown in FIG. 3C.

In FIG. 3C, since the rising edge of the clock signal $CLK_{REF}$ is aligned with a level of the clock signal $CLK_{DL}$ and the level is the level $V_3$, the indication signal UP is maintained at level $V_1$. Therefore, the control unit 140 still increases the delay factor SETTING. In FIG. 3D, since the rising edge of the clock signal $CLK_{REF}$ is aligned with a level of the clock signal $CLK_{DL}$ and the level is the level $V_4$, the indication signal UP is changed to level $V_2$. Therefore, the control unit 140 reduces the delay factor SETTING until the rising edge of the clock signal $CLK_{DL}$ is aligned with the rising edge of the clock signal $CLK_{REF}$.

Figure 4A:
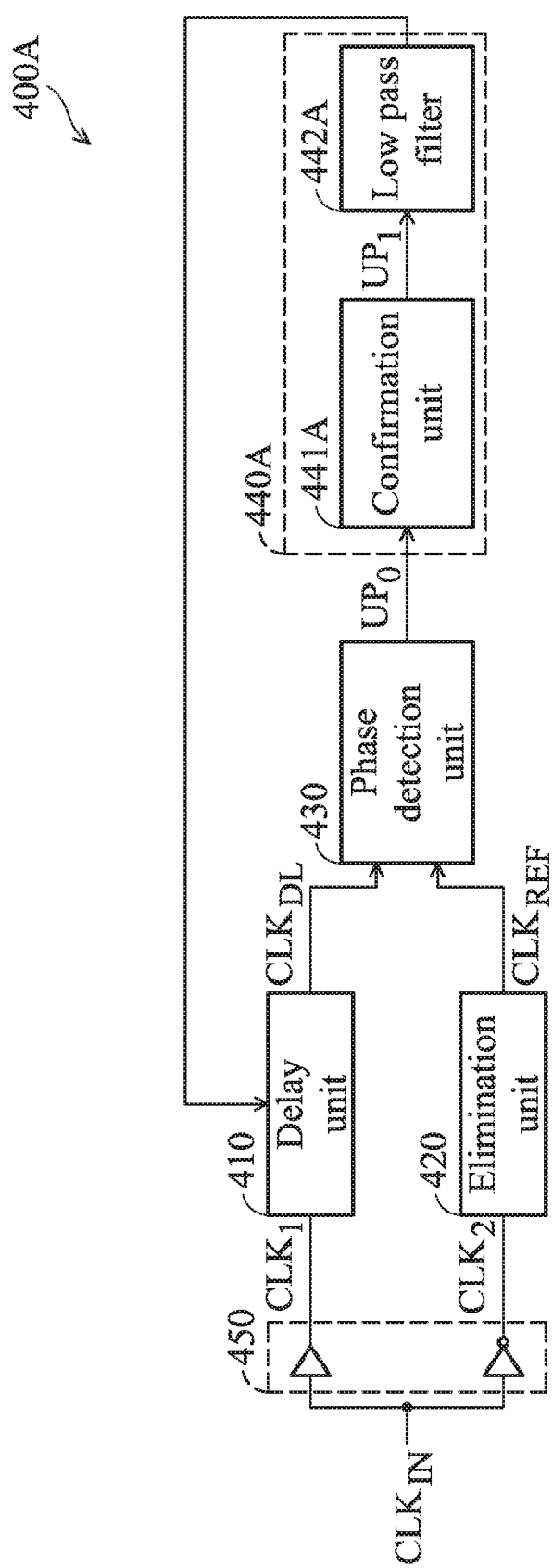
FIGS. 4A~4B are schematic diagrams of exemplary embodiments of a delay lock loop, according to various aspects of the present disclosure.

FIG. 4 is a schematic diagram of another exemplary embodiment of the delay lock loop, according to various aspects of the present disclosure. FIG. 4A is similar to FIG. 1B exception that the control unit 440A shown in FIG. 4A detects the duration during which the indication signal $UP_0$ is at the level $V_1$. When the duration during which the indication signal $UP_0$ is at the level $V_1$ does not arrive at a pre-determined value, even if the indication signal $UP_0$ is at the level $V_2$, the control unit 440 still increases the delay factor. However, when the duration during which the indication signal $UP_0$ is at the level $V_1$ arrives at the pre-determined value, the control unit 440A adjusts the delay factor according to the level of the indication signal $UP_0$.

In one embodiment, the delay unit 410, the elimination unit 420, the phase detection unit 430 and the buffer unit 450 shown in FIG. 4A are the same as the delay unit 110, the elimination unit 120, the phase detection unit 130 and the buffer unit 150 shown in FIG. 1B respectively, so descriptions of the delay unit 410, the elimination unit 420, the phase detection unit 430 and the buffer unit 450 shown in FIG. 4A are omitted. In this embodiment, the control unit 440A comprises a confirmation unit 441A and a low pass filter 442A.

The confirmation unit 441A is coupled between the phase detection unit 430 and the low pass filter 442A to determine whether the duration during which the indication signal $UP_0$ is at the level $V_1$ arrives at a pre-determined value and generate a control signal $UP_1$ according to the determined result. For example, when the duration during which the indication signal $UP_0$ is at the level $V_1$ does not arrive at the pre-determined value, the confirmation unit 441A directs the control signal $UP_1$ to the level $V_1$. When the duration during which the indication signal $UP_0$ is at the level $V_1$ arrives at the pre-determined value, the confirmation unit 441A uses the indication signal $UP_0$ as the control signal $UP_1$.

The low pass filter 442A adjusts the delay factor of the delay unit 410 according to the control signal $UP_1$. For example, when the control signal $UP_1$ is at the level $V_1$, the low pass filter 442A increases the delay factor of the delay unit 410. When the control signal $UP_1$ is at the level $V_2$, the low pass filter 442A reduces the delay factor of the delay unit 410.

Figure 4B:
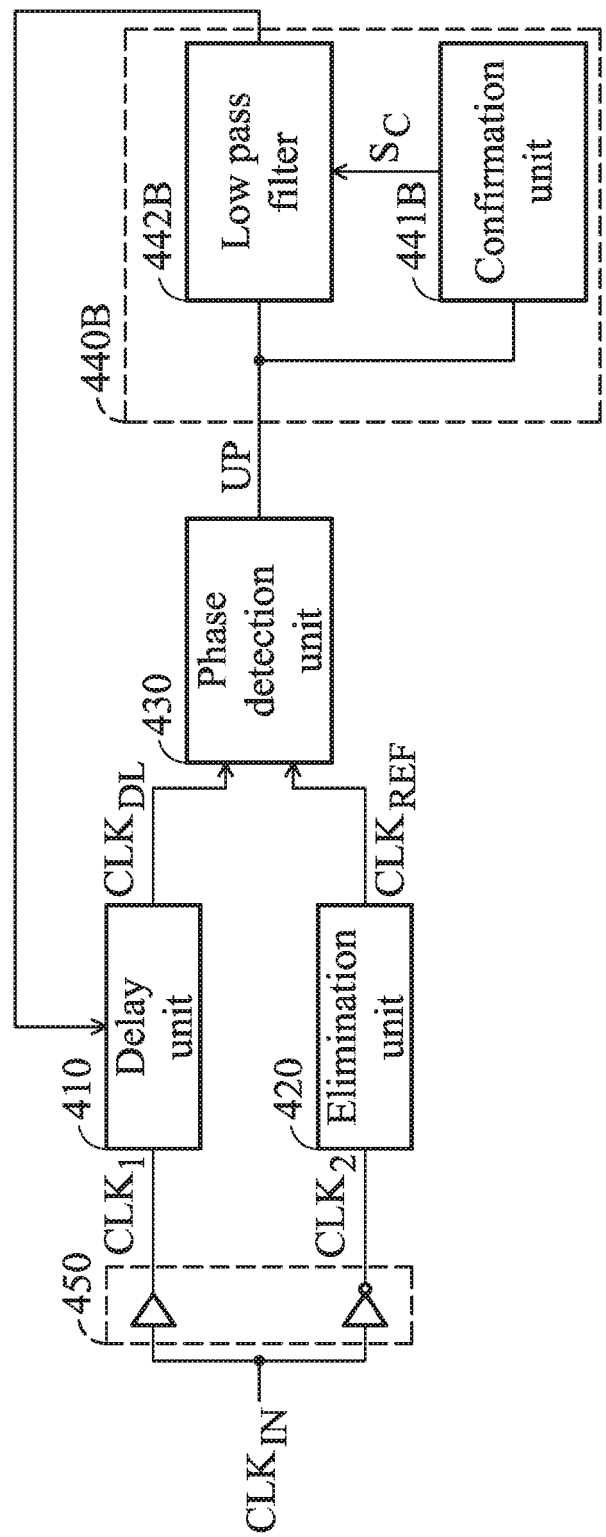

FIG. 4B is a schematic diagram of another exemplary embodiment of the delay lock loop, according to various aspects of the present disclosure. FIG. 4B is similar to FIG. 4A exception that the low pass filter 442B is coupled between the phase detection unit 430 and the delay unit 410. In this embodiment, the delay unit 410, the elimination unit 420, the phase detection unit 430 and the buffer unit 450 shown in FIG. 4B are the same as the delay unit 110, the elimination unit 120, the phase detection unit 130 and the buffer unit 150 shown in FIG. 1B respectively, so descriptions of the delay unit 410, the elimination unit 420, the phase detection unit 430 and the buffer unit 450 shown in FIG. 4B are omitted.

In this embodiment, the confirmation unit 441B determines whether the duration during which the indication signal UP is at the level $V_1$ arrives at a pre-determined value and generates a control signal $S_C$ according to the determined result. The low pass filter 442B adjusts the delay factor of the delay unit 410 according to the control signal $S_C$ and the indication signal UP. For example, when the duration during which the indication signal UP is at the level $V_1$ does not arrive at the pre-determined value, no matter whether the indication signal UP is at the level $V_1$ or $V_2$, the low pass filter 442B increases the delay factor of the delay unit 410. When the duration during which the indication signal UP is at the level $V_1$ arrives at the pre-determined value, the low pass filter 442B adjusts the delay factor of the delay unit 410 according to the level of the indication signal UP.

For the delay lock loop 400A shown in FIG. 4A, when the delay lock loop 400A begins to be initiated, since the delay lock loop 400A just receive power, the phase detection unit 430 may provide an indication signal $UP_0$ with an inaccurate level. To avoid the indication signal UP with the inaccurate level causing the adjustment of the delay factor, the confirmation unit 441A is utilized to determine the duration during which the indication signal $UP_0$ is at a specific level. If the duration during which the indication signal $UP_0$ is at the specific level arrives at a pre-determined value, it means the indication signal $UP_0$ is correct. Therefore, the indication signal $UP_0$ is utilized to adjust the delay factor. In other words, the control signal $UP_1$ is directed to equal to the indication signal $UP_0$. If the duration during which the indication signal $UP_0$ is at the specific level does not arrive at the pre-determined value, it means that the indication signal UP is inaccurate. At this time, the control signal $UP_1$ is directed to 1 to increase the delay factor of the delay unit 410 and then the phase detection unit 430 continually detects the clock signals $CLK_{DL}$ and $CLK_{REF}$ until the duration during which the indication signal $UP_0$ is at the specific level arrives at the pre-determined value. Then, the indication signal $UP_0$ is utilized to adjust the delay factor of the delay unit 110. In FIG. 4B, the confirmation unit 441B is utilized to determine whether the duration during which the indication signal $UP_0$ is at the specific level.

Figure 5:
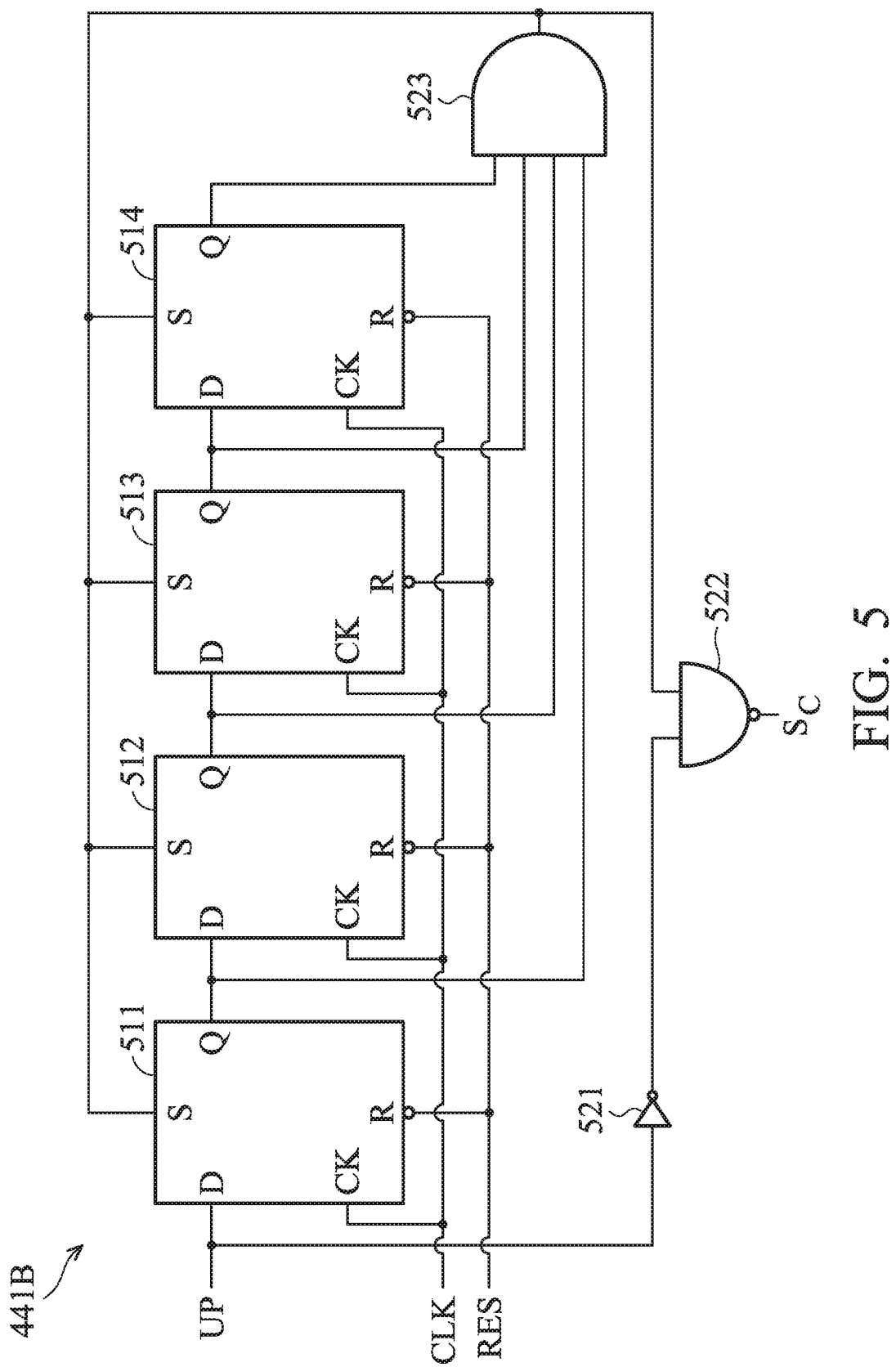
FIG. 5 is a schematic diagram of an exemplary embodiment of an confirmation unit shown in FIG. 4B, according to various aspects of the present disclosure.

FIG. 5 is a schematic diagram of an exemplary embodiment of the confirmation unit 441B shown in FIG. 4B, according to various aspects of the present disclosure. As shown in FIG. 5, the confirmation unit 441B comprises D-type flip-flops 511~514 and logic gates 521~523, but the disclosure is not limited thereto. In other embodiments, any circuit can serve as a confirmation unit 441B, as long as the circuit is capable of determining the duration during which the indication signal UP is at the level $V_1$. In addition, the confirmation unit 441B may comprise any number of D-type flip-flops in some embodiments.

In this embodiment, the D-type flip-flops 511~514 are connected in series with one another. The input terminal D of each of the D-type flip-flops 511~514 receives the output of the previous D-type flip-flop, wherein the input terminal D of the first D-type flip-flop receives the indication signal UP. The set terminal S of each of the D-type flip-flops 511~514 is coupled to the output of the logic gate 523. The clock terminal CK of each of the D-type flip-flops 511~514 receives a clock signal CLK. The reset terminal R of each of the D-type flip-flops 511~514 receives a reset signal RES.

The logic gate 521 is an inverter to invert the indication signal UP and provides the inverted indication signal to the logic gate 522. The logic gate 522 is a NAND gate. The logic gate 523 is an AND gate and receives the output signals of the D-type flip-flops 511~514.

When the duration of the indication signal UP being at the level $V_1$ does not arrive at a pre-determined value, one of the output signals of the D-type flip-flops 511~514 is at a low level. Therefore, the logic gate 523 outputs the low level so that the control signal $S_C$ is at a high level. At this time, the low pass filter 442B increases the delay factor of the delay unit 410. However, when the duration of the indication signal UP being at the level $V_1$ arrives at the pre-determined value, the output signals of the D-type flip-flops 511~514 are at the high level. Therefore, the logic gate 523 outputs the high level. At this time, the level of the control signal Sc is the same as the level of the indication signal UP. When the indication signal UP is at the level $V_1$, the control signal $S_C$ is also at the level $V_1$. Therefore, the low pass filter 442B increases the delay factor of the delay unit 410. When the indication signal UP is at the level $V_2$, the control signal $S_C$ is also at the level $V_2$. Therefore, the low pass filter 442B reduces or stops adjust the delay factor of the delay unit 410. Furthermore, when the output of the D-type flip-flops 511~514 are at the high level, the logic gate 523 de-activates the D-type flip-flops 511~514 to stop determining the duration of the indication signal UP being at the level $V_1$.

Figure 6A:
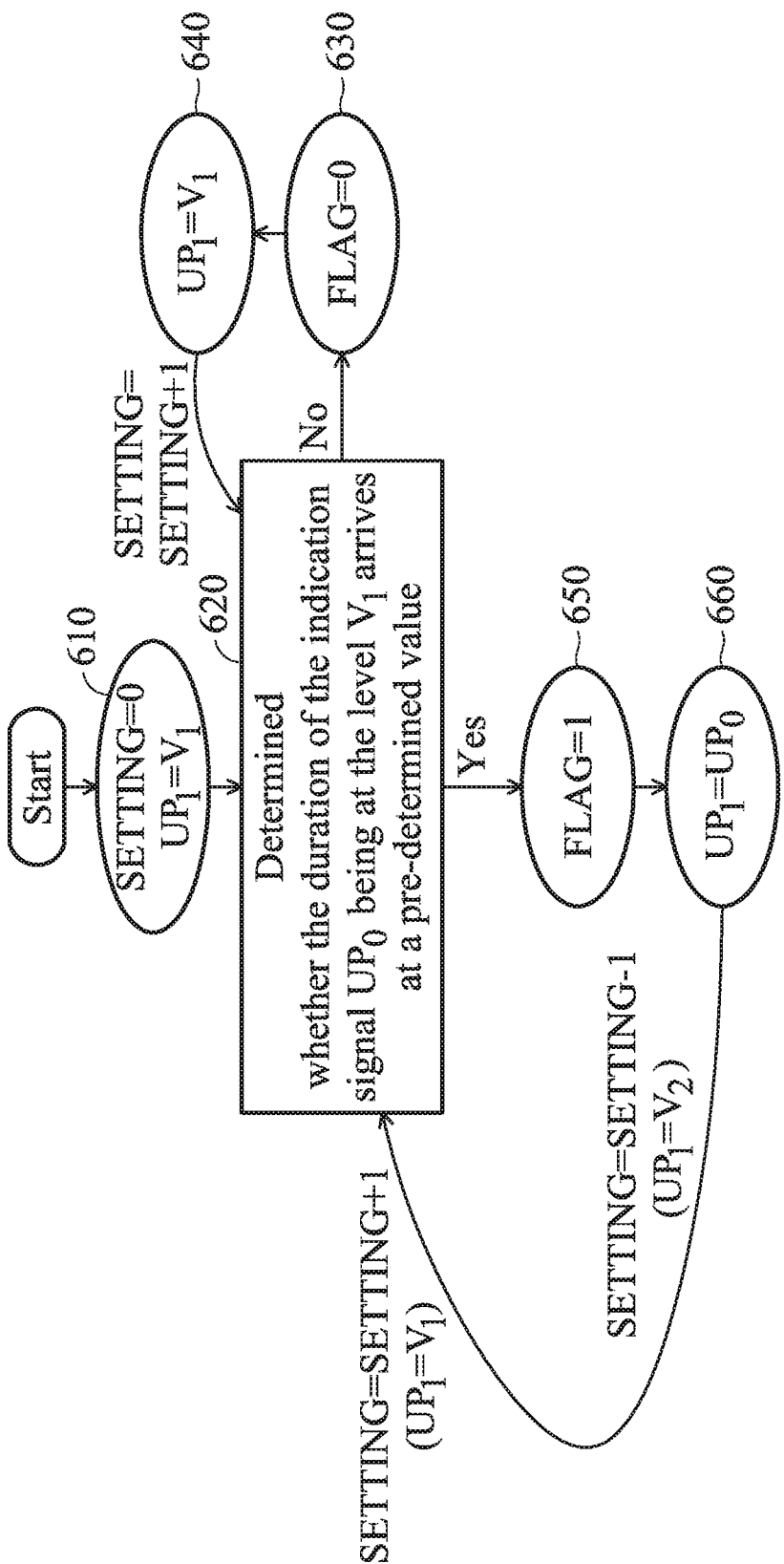
FIG. 6A is a state schematic diagram of an exemplary embodiment of the delay lock loop shown in FIG. 4A, according to various aspects of the present disclosure.

FIG. 6A is a state schematic diagram of an exemplary embodiment of the delay lock loop 400A shown in FIG. 4A, according to various aspects of the present disclosure. First, in state 610, the delay factor SETTING of the delay unit 410 is reset to an initial value, such as 0. At this time, the control signal $UP_1$ is an initial level, such as the level $V_1$. In state 620, it is determined whether the duration of the indication signal $UP_0$ being at the level $V_1$ arrives at a pre-determined value. If the duration of the indication signal $UP_0$ being at the level $V_1$ does not arrive at the pre-determined value, the value FLAG of a flag of the confirmation unit 441A is set to 0 in state 630. In state 640, the control signal $UP_1$ is set to the level $V_1$. Therefore, the low pass filter 442A increases the delay factor SETTING of the delay unit 410 and state 620 is entered.

When the duration of the indication signal $UP_0$ being at the level $V_1$ arrives at the pre-determined value, the value FLAG of a flag of the confirmation unit 441A is set to 1 in state 650. In state 660, the control signal $UP_1$ is equal to the indication signal $UP_0$. At this time, when the control signal $UP_1$ is at the level $V_1$, the low pass filter 442A increases the delay factor SETTING of the delay unit 410. When the control signal $UP_1$ is at the level $V_2$, the low pass filter 442A reduces the delay factor SETTING of the delay unit 410.

Figure 6B:
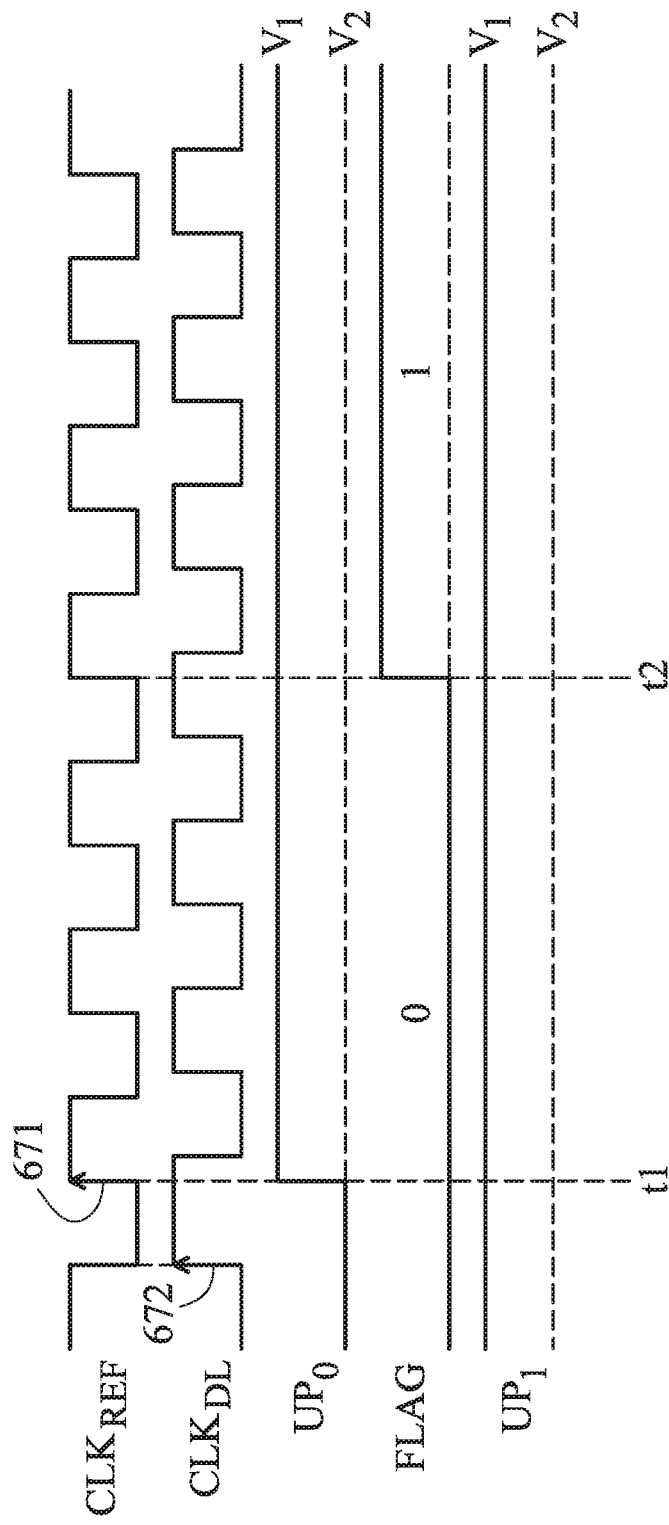
FIG. 6B is a clock schematic diagram of exemplary embodiments of the delay lock loop shown in FIG. 4A, according to various aspects of the present disclosure.

FIG. 6B is a clock schematic diagram of an exemplary embodiment of the delay lock loop 400A of FIG. 4A, according to various aspects of the present disclosure. Since the rising edge 672 of the clock signal $CLK_{DL}$ leads the rising edge 671 of the clock signal $CLK_{REF}$, the indication signal $UP_0$ is at the level $V_1$. At this time, since the duration of the indication signal $UP_0$ being at the level $V_1$ does not arrive at a pre-determined value, the value FLAG of the flag is set to 0 at the time point t1. Therefore, the control signal $UP_1$ is at the level $V_1$. The low pass filter 442A increases the delay factor SETTING of the delay unit 410. At the time point t2, the duration of the indication signal $UP_0$ being at the level $V_1$ arrives at the pre-determined value, the value FLAG of the flag is set to 1. At this time, the control signal $UP_1$ is equal to the indication signal $UP_0$.

Figure 7A:
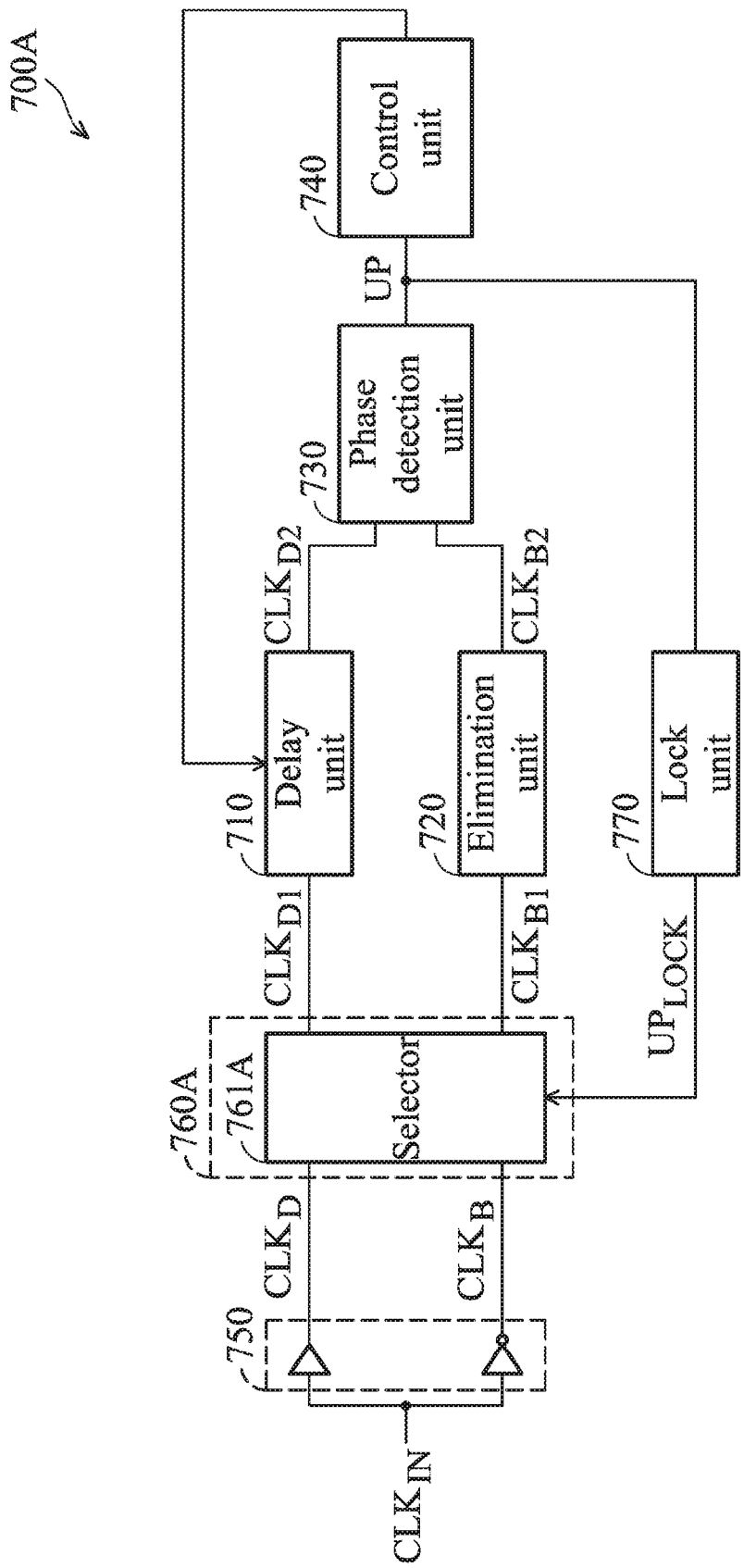
FIGS. 7A~7B are schematic diagrams of exemplary embodiments of a delay lock loop, according to various aspects of the present disclosure.
Figure 7B:
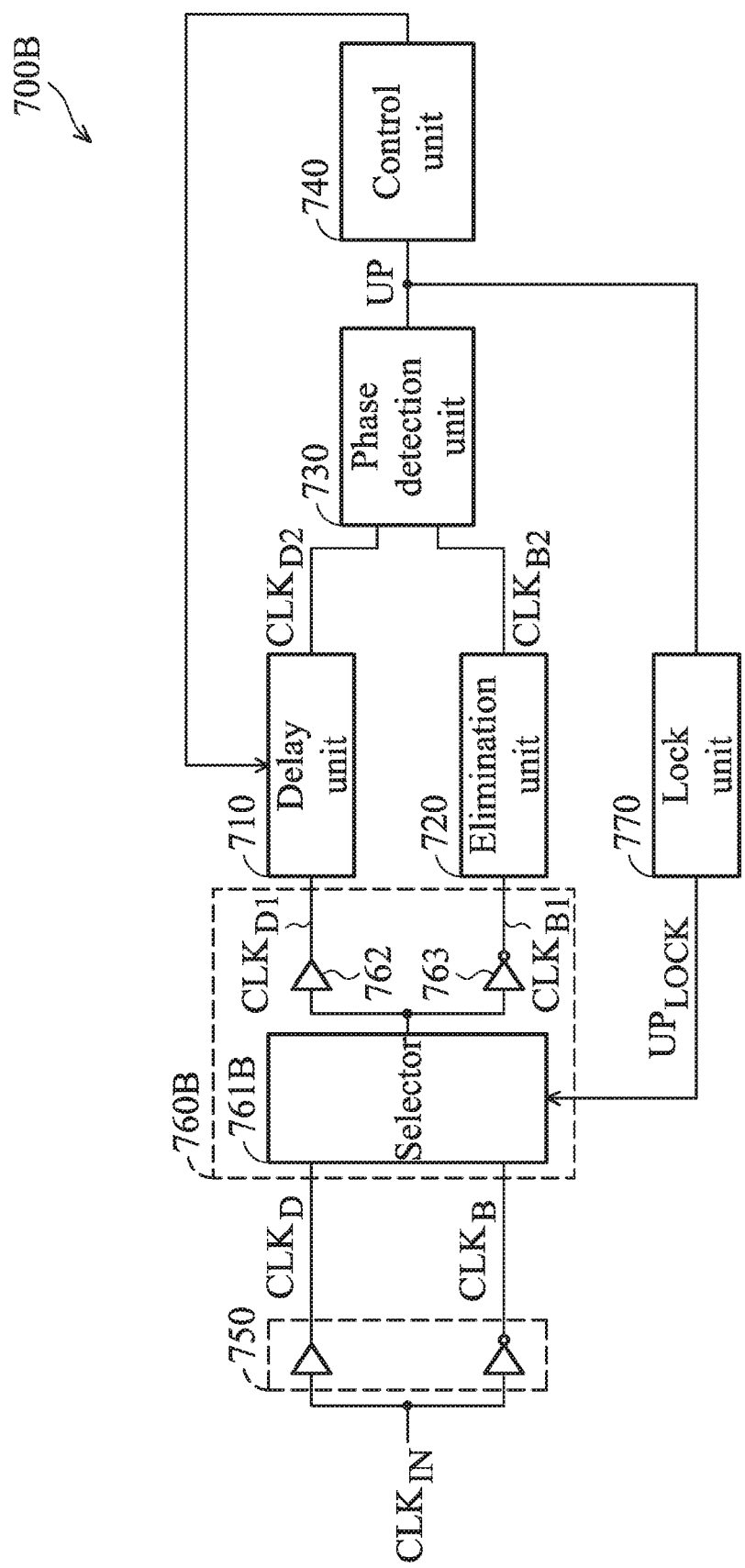

FIGS. 7A and 7B are schematic diagram of exemplary embodiments of the delay lock loop, according to various aspects of the present disclosure. FIG. 7A is similar to FIG. 1B except that the delay lock loop 700A further comprises a selection unit 760A and a lock unit 770. Since the delay unit 710, the elimination unit 720, the phase detection unit 730, the control unit 740 and the buffer unit 750 shown in FIG. 7A are the same as the delay unit 110, the elimination unit 120, the phase detection unit 130, the control unit 140 and the buffer unit 150 shown in FIG. 1B respectively, the descriptions of the delay unit 710, the elimination unit 720, the phase detection unit 730, the control unit 740 and the buffer unit 750 shown in FIG. 7A are omitted.

Compared to delay lock loop 100B, a maximum delay time by which the delay lock loop 700A or 700B delays the input clock signal $CLK_{IN}$ is double a maximum delay time by which the delay lock loop 100B delays the input clock signal $CLK_{IN}$. The delay lock loop 700A or 700B only utilizes one delay unit to achieve a delay result achieved by two delay unit of the conventional delay lock loop. Each of the delay lock loops 700A and 700B utilizes a selection unit and a lock unit to replace a delay unit which has a complex circuit design and takes up a lot of space. The selection unit and the lock unit has a simple circuit design and do not take up a lot of space. Therefore, the delay lock loops 700A and 700B are better than the conventional delay lock loop. As shown in FIG. 7A, the selection unit 760A receives the buffer clock signals $CLK_D$ and $CLK_B$ and generates the clock signal $CLK_{D1}$ and $CLK_{B1}$ according to a lock signal $UP_{LOCK}$. In one embodiment, when the lock signal $UP_{LOCK}$ is in a first state, the selection unit 760A uses the buffer clock signal $CLK_D$ as the clock signal $CLK_{D1}$ and uses the buffer clock signal $CLK_B$ as the clock signal $CLK_{B1}$. However, when the lock signal $UP_{LOCK}$ is in a second state, the selection unit 760A uses the buffer clock signal $CLK_B$ as the clock signal $CLK_{D1}$ and uses the buffer clock signal $CLK_D$ as the clock signal $CLK_{B1}$. In this embodiment, the selection unit 760A is a selector 761A, such as a multiplexer.

The lock unit 770 generates the lock signal $UP_{LOCK}$ according to the indication signal UP. In one embodiment, when the initiation processes of the delay lock loops 700A and 700B are started, if the indication signal UP is first changed from 0 to 1, the indication signal UP is at the level $V_1$, the lock signal $UP_{LOCK}$ is in the first state, which may be maintained at the level $V_1$. Therefore, the lock signal $UP_{LOCK}$ is locked at 1. Then, the lock signal $UP_{LOCK}$ is locked in the first state no matter what the detection result of the phase detection unit 730 is. However, when the indication signal UP is at the level $V_2$, the lock signal $UP_{LOCK}$ is in the second state, which may be the level $V_2$.

In one embodiment, the initial value of the lock signal $UP_{LOCK}$ is the first state. Therefore, the selection unit 760A first uses the buffer clock signal $CLK_D$ as the clock signal $CLK_{D1}$. The control unit 710 adjusts the delay factor of the delay unit 710 according to the indication signal UP. When the time difference between the clock signals $CLK_{D2}$ and $CLK_{B2}$ is approximately equal to the time of a half of the duty cycle of the clock signal $CLK_{B2}$, the lock unit 770 sets the lock signal $UP_{LOCK}$ to the second state. The selection unit 760A uses the buffer clock signal $CLK_B$ as the clock signal $CLK_{D1}$. The control unit 710 continuously adjusts the delay factor of the delay unit 710 according to the indication signal UP. At this time, when the delay factor of the delay unit 710 is a maximum value, the time difference between the clock signals $CLK_{D2}$ and $CLK_{B2}$ is equal to the time of a duty cycle of the clock signal $CLK_{B2}$.

Compared to FIG. 1B, when the delay factor of the delay unit 110 is a maximum value, the time difference between the clock signals $CLK_{DL}$ and $CLK_{REF}$ is approximately equal to the time of a half of the duty cycle of the clock signal $CLK_{REF}$. In FIG. 7A, although the internal structure of the delay unit 710 is the same as the internal structure of the delay unit 110, since the time difference between the clock signals $CLK_{D2}$ and $CLK_{B2}$ is approximately equal to the time of a duty cycle of the clock signal $CLK_{B2}$, a maximum delay time provided by the delay lock loop 700A is a double of the maximum delay time provided by the delay lock loop 100B.

In FIG. 7B, the selection unit 760B comprises a selector 761B, a buffer 762 and an inverter 763. The selector 761B outputs the buffer clock signal $CLK_D$ or $CLK_B$ according to the lock signal $UP_{LOCK}$. In one embodiment, when the lock signal $UP_{LOCK}$ is in the first state, the selector 761 outputs the buffer clock signal $CLK_D$, and when the lock signal $UP_{LOCK}$ is in the second state, the selector 761 outputs the buffer clock signal $CLK_B$. The buffer 762 processes the output signal of the selector 761B to generate the clock signal $CLK_{D1}$. The inverter 763 inverts the output signal of the selector 761B to generate the clock signal $CLK_{B1}$.

Figure 8A:
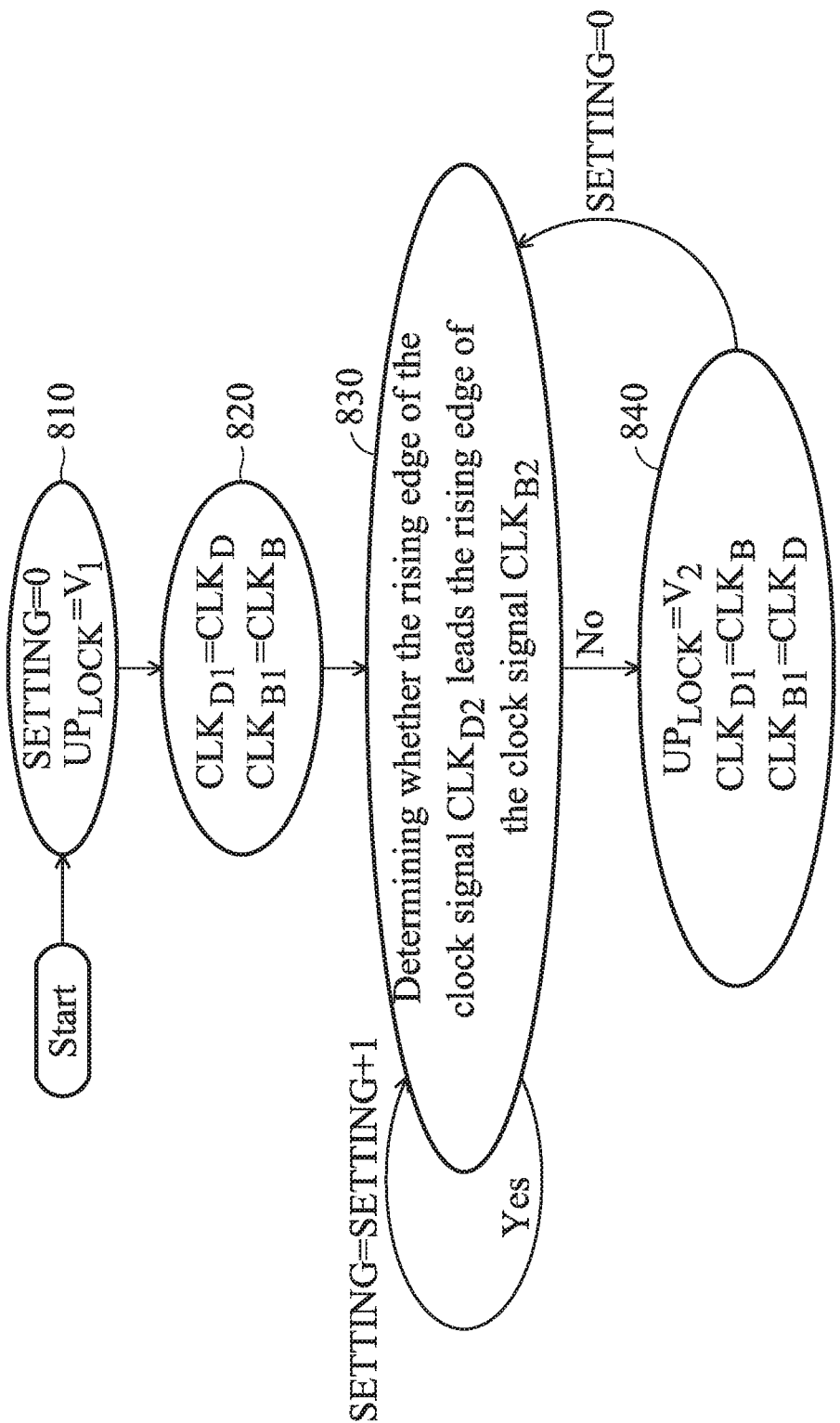
FIG. 8A is a state schematic diagram of an exemplary embodiment of the delay lock loop shown in FIG. 7A, according to various aspects of the present disclosure.

FIG. 8A is a state schematic diagram of an exemplary embodiment of the delay lock loop shown in FIG. 7A, according to various aspects of the present disclosure. First, in state 810, the delay factor SETTING of the delay unit 710 is reset to an initial value, such as 0. At this time, the lock signal $UP_{LOCK}$ is in an initial state, such as the level $V_1$. Therefore, in state 820, the selector 761A uses the buffer clock signal $CLK_D$ as the clock signal $CLK_{D1}$ and uses the buffer clock signal $CLK_B$ as the clock signal $CLK_{B1}$. In state 830, the phase detection unit 730 determines whether the rising edge of the clock signal $CLK_{D2}$ leads the rising edge of the clock signal $CLK_{B2}$. If the rising edge of the clock signal $CLK_{D2}$ leads the rising edge of the clock signal $CLK_{B2}$, the delay factor SETTING is increased and state 830 is entered. If the rising edge of the clock signal $CLK_{D2}$ does not lead the rising edge of the clock signal $CLK_{B2}$, the state of lock signal $UP_{LOCK}$ follows the indication signal UP, such as from the level $V_1$ to the level $V_2$. At this time, the selector 761A uses the buffer clock signal $CLK_B$ as the clock signal $CLK_{D1}$ and uses the buffer clock signal $CLK_D$ as the clock signal $CLK_{B1}$. Then, the delay factor SETTING of the delay unit 710 is reset to 0 and state 830 is entered. At this time, the delay unit 710 still delays the clock signal $CLK_{D2}$ until the rising edge of the clock signal $CLK_{D2}$ is aligned with the rising edge of the clock signal $CLK_{B2}$ in the next cycle. Therefore, if the selection unit 760A is omitted from the delay lock loop 700A, the delay lock loop 700A does not process the clock signal $CLK_{D1}$ when the rising edge of the clock signal $CLK_{D2}$ is aligned with the rising edge of the clock signal $CLK_{B2}$. However, if the selection unit 760A is added into the delay lock loop 700A, when the rising edge of the clock signal $CLK_{D2}$ is aligned with the rising edge of the clock signal $CLK_{B2}$ again, the delay lock loop 700A stops delaying the clock signal $CLK_{D1}$. Therefore, the maximum delay time by which delay lock loop 700A delays the input clock signal $CLK_{IN}$ (or $CLK_1$) is double the maximum delay time by which delay lock loop 100B delays the input clock signal $CLK_{IN}$ (or $CLK_1$).

Figure 8B:
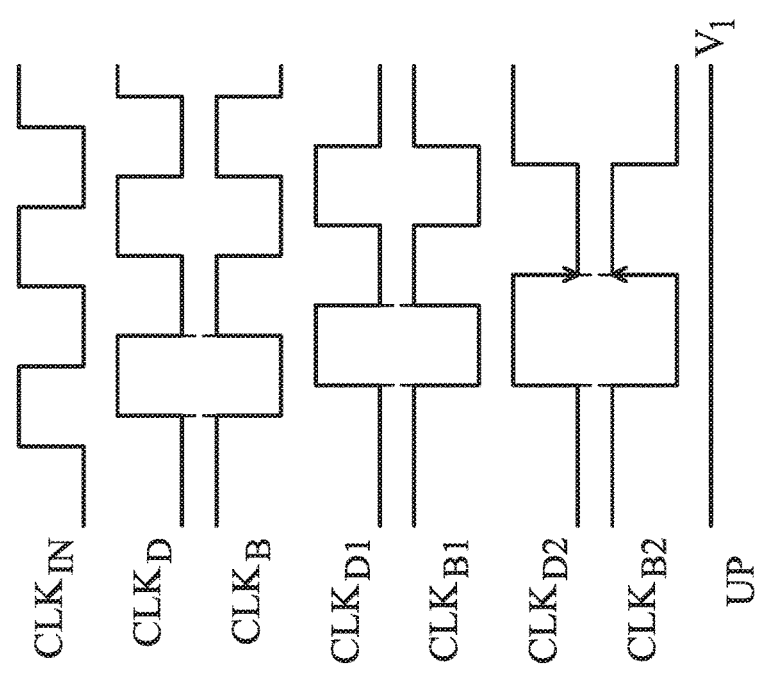
FIGS. 8B~8D are clock schematic diagrams of exemplary embodiments of the delay lock loop shown in FIG. 7A, according to various aspects of the present disclosure.
Figure 8C:
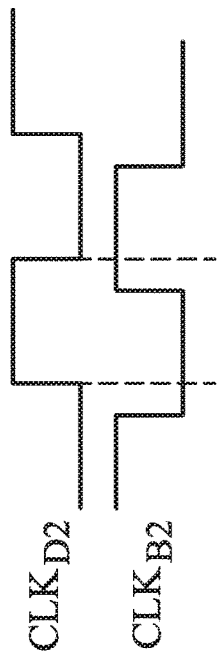
Figure 8D:
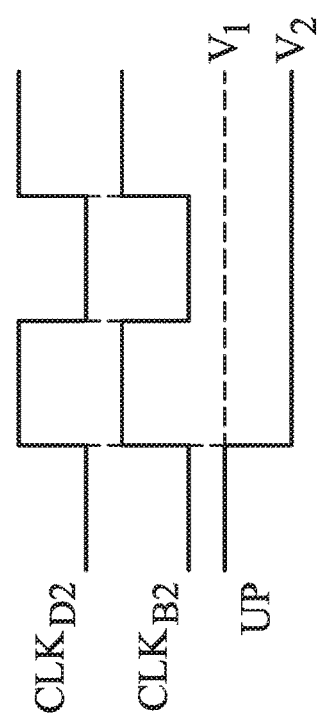

FIGS. 8B~8D are clock schematic diagrams of exemplary embodiments of the delay lock loop of FIG. 7A, according to various aspects of the present disclosure. In FIG. 8B, assuming that the first falling edge of the clock signal $CLK_{D2}$ is aligned with the rising edge of the clock signal $CLK_{B2}$. At this time, the indication signal UP is an initial level, such as $V_1$. Therefore, the control unit 710 increases the delay factor of the delay unit 710. As shown in FIG. 8C, the falling edge of the clock signal $CLK_{D2}$ follows the rising edge of the clock signal $CLK_{B2}$.

When the rising edge of the clock signal $CLK_{D2}$ is aligned with the rising edge of the clock signal $CLK_{B2}$, the indication signal UP is changed from the level $V_1$ to the level $V_2$. At this time, the delay factor SETTING of the delay unit 710 is reset to 0 and the phase detection unit 730 again detects the phase difference between the clock signals $CLK_{D2}$ and $CLK_{B2}$.

Figure 9A:
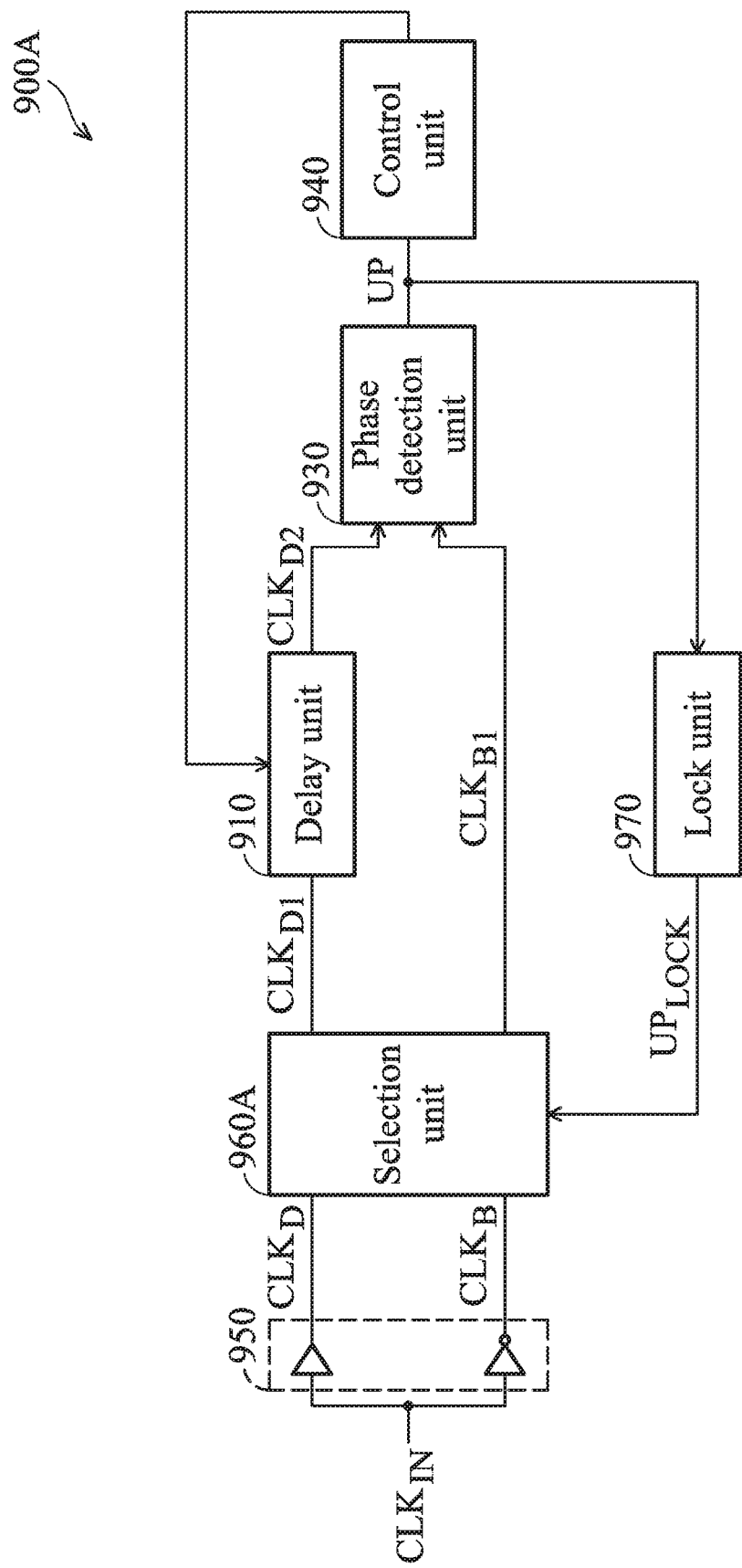
FIGS. 9A~9B are schematic diagrams of exemplary embodiments of a delay lock loop, according to various aspects of the present disclosure.
Figure 9B:
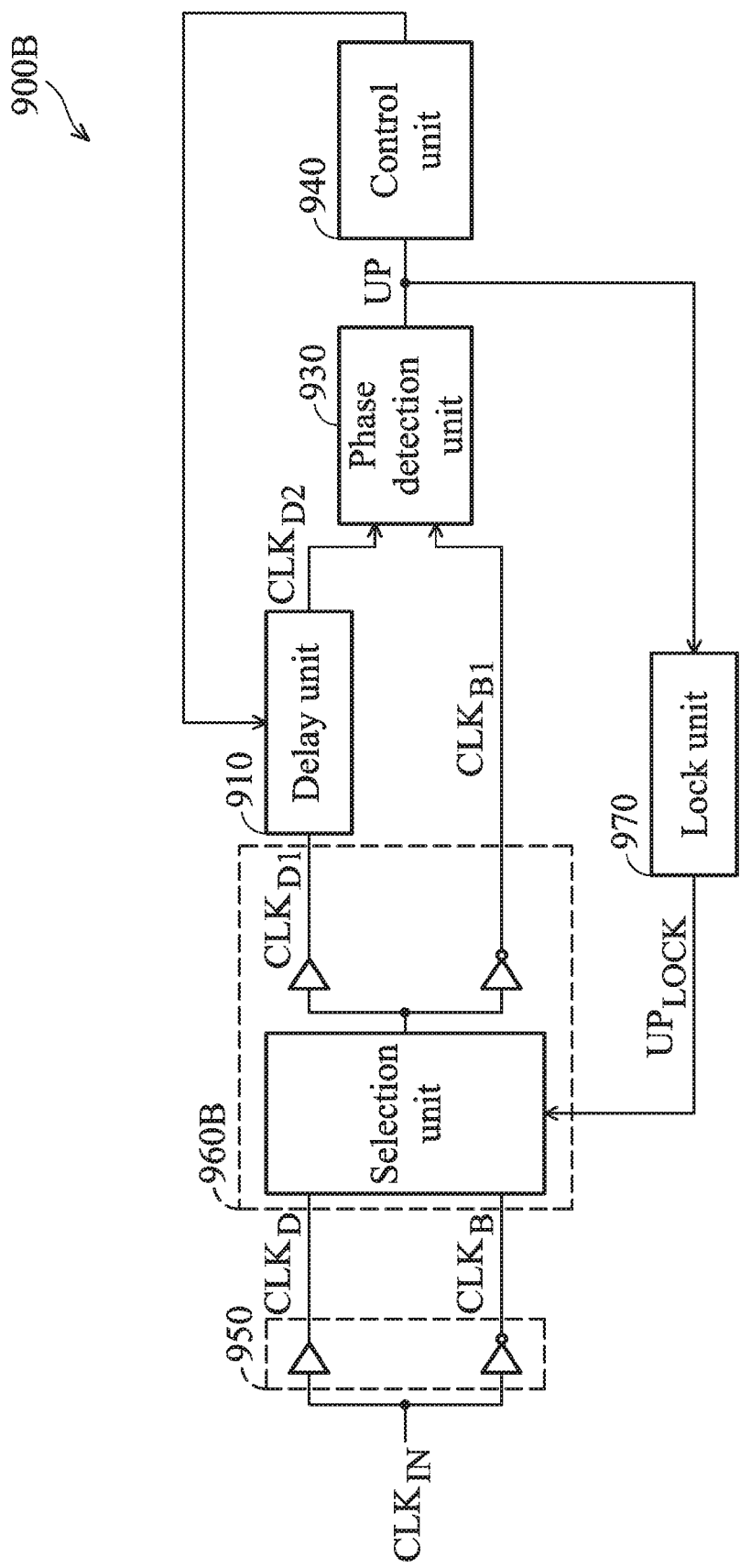

FIGS. 9A~9B are schematic diagrams of exemplary embodiments of a delay lock loop, according to various aspects of the present disclosure. FIG. 9A is similar to FIG. 7A exception that the delay lock loop 900A does not comprise an elimination unit. In this case, the phase detection unit 930 detects the phase difference between the clock signals $CLK_{D2}$ and $CLK_{B1}$. For example, when the rising edge of the clock signal $CLK_{B1}$ leads the falling edge of the clock signal $CLK_{D2}$, the indication signal UP is at a first level. At this time, the lock signal $UP_{LOCK}$ is in a first state, which may represent the level of the lock signal $UP_{LOCK}$ is fixed at the level $V_1$. Therefore, the selection unit 960A uses the clock signal $CLK_D$ as the clock signal $CLK_{D1}$ and uses the clock signal $CLK_B$ as the clock signal $CLK_{B1}$. When the rising edge of the clock signal $CLK_{B1}$ is aligned with the rising edge of the clock signal $CLK_{D2}$, the indication signal UP is at a second level. At this time, the lock signal $UP_{LOCK}$ is in a second state, which may represent the level of the lock signal $UP_{LOCK}$ is fixed at the level $V_2$. Therefore, the selection unit 960A uses the clock signal $CLK_B$ as the clock signal $CLK_{D1}$ and uses the clock signal $CLK_D$ as the clock signal $CLK_{B1}$. In one embodiment, when the rising edge of the clock signal $CLK_{B1}$ is aligned with the rising edge of the clock signal $CLK_{D2}$, the delay factor of the delay unit 910 is reset to an initial value.

Since the delay unit 910, the phase detection unit 930, the control unit 940 and the buffer unit 950 shown in FIG. 9A are the same as the delay unit 110, the phase detection unit 130, the control unit 140 and the buffer unit 150 shown in FIG. 1B respectively, the descriptions of delay unit 910, the phase detection unit 930, the control unit 940 and the buffer unit 950 shown in FIG. 9A are omitted.

FIG. 9B is similar to FIG. 7B exception that the delay lock loop 900B does not comprise an elimination unit. In this case, the phase detection unit 930 detects the phase difference between the clock signals $CLK_{D2}$ and $CLK_{B1}$. Since the delay unit 910, the phase detection unit 930, the control unit 940 and the buffer unit 950 shown in FIG. 9B are the same as the delay unit 110, the phase detection unit 130, the control unit 140 and the buffer unit 150 shown in FIG. 1B respectively, the descriptions of delay unit 910, the phase detection unit 930, the control unit 940 and the buffer unit 950 shown in FIG. 9B are omitted. Furthermore, the selection unit 960B and the lock unit 970 of FIG. 9B are the same as the selection unit 760B and the lock unit 770 of FIG. 7A respectively, the descriptions of the selection unit 960B and the lock unit 970 of FIG. 9B are omitted.

Figure 10A:
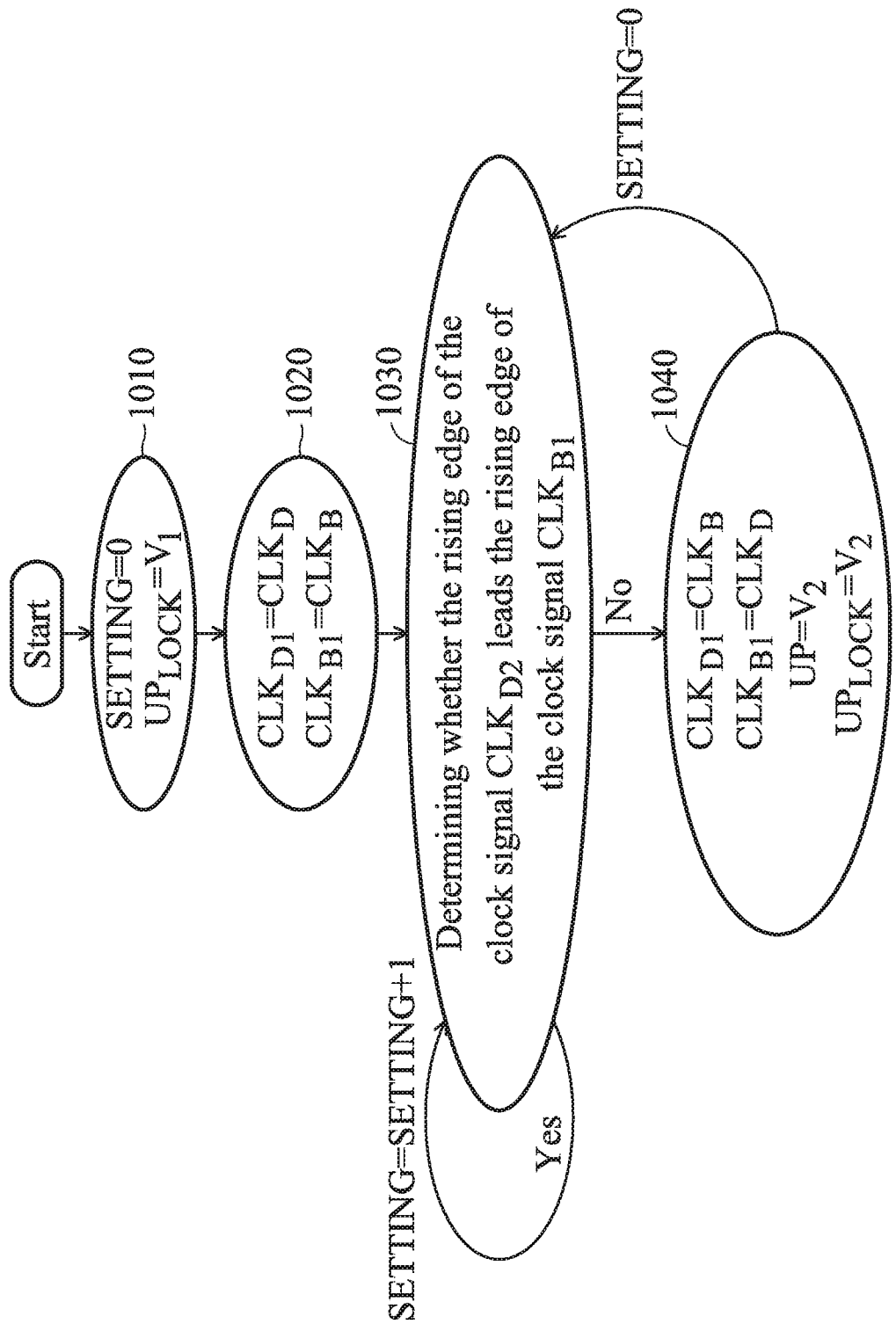
FIG. 10A is a state schematic diagram of an exemplary embodiment of the delay lock loop shown in FIG. 9A, according to various aspects of the present disclosure.

FIG. 10A is a state schematic diagram of an exemplary embodiment of the delay lock loop of FIG. 9A, according to various aspects of the present disclosure. First, in state 1010, the delay factor SETTING of the delay unit 910 is reset to 0 and the lock signal $UP_{LOCK}$ is set to a first state, such as a level $V_1$. Therefore, in state 1020, the selection unit 960A uses the buffer clock signal $CLK_D$ as the clock signal $CLK_{D1}$ and uses the buffer clock signal $CLK_B$ as the clock signal $CLK_{B1}$. In state 1030, the phase detection unit 930 determines whether the rising edge of the clock signal $CLK_{D2}$ leads the rising edge of the clock signal $CLK_{B1}$. If the rising edge of the clock signal $CLK_{D2}$ leads the rising edge of the clock signal $CLK_{B1}$, the control unit 940 increases the delay factor of the delay unit 910. If the rising edge of the clock signal $CLK_{D2}$ does not lead the rising edge of the clock signal $CLK_{B1}$, the selection unit 960A uses the buffer clock signal $CLK_D$ as the clock signal $CLK_{B1}$ and uses the buffer clock signal $CLK_B$ as the clock signal $CLK_{D1}$. In state 1040, the indication signal UP is a level $V_2$ and the lock signal $UP_{LOCK}$ is set to a second state, such as the level $V_2$. Then the delay factor SETTING of the delay unit 910 is reset to 0 and state 1030 is entered.

Figure 10B:
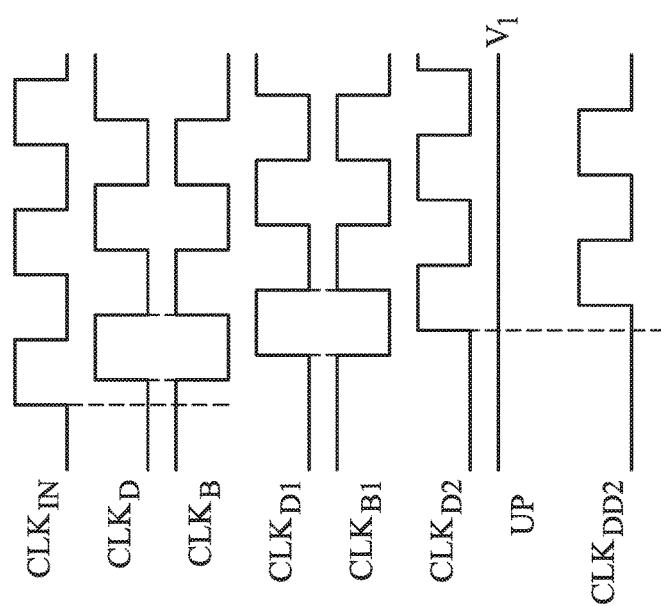
FIGS. 10B~10C are clock schematic diagrams of exemplary embodiments of the delay lock loop shown in FIG. 9A, according to various aspects of the present disclosure.
Figure 10C:
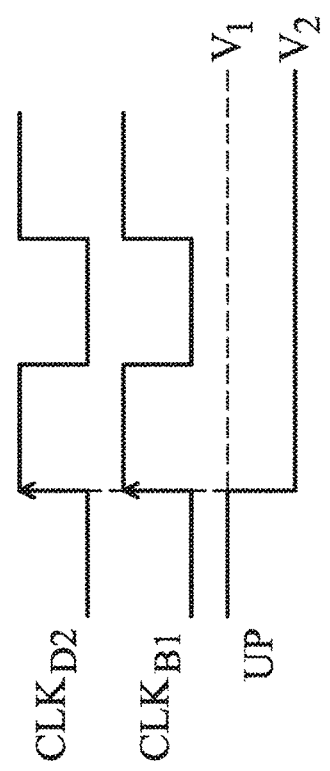

FIGS. 10B and 10C are clock schematic diagrams of exemplary embodiments of the delay lock loop of FIG. 9A, according to various aspects of the present disclosure. In FIG. 10B, since the rising edge of the clock signal $CLK_{D2}$ leads the rising edge of the clock signal $CLK_{B1}$, the indication signal UP is at the level $V_1$. Therefore, the control unit 940 increases the delay factor SETTING of the delay unit 910 until the indication signal UP is at the level $V_2$. The symbol $CLK_{DD2}$ represents the delayed clock signal $CLK_{D2}$.

In FIG. 10C, when the rising edge of the clock signal $CLK_{D2}$ is aligned with the rising edge of the clock signal $CLK_{B1}$, the indication signal UP is changed from the level $V_1$ to the level $V_2$. At this time, the lock signal $UP_{LOCK}$ is changed from the first state to the second state and the delay factor SETTING of the delay unit 910 is reset to an initial value.

In this embodiment, the delay unit 910 shown in FIG. 9A or 9B is the same as the delay unit 110 shown in FIG. 1B, but a maximum delay time by which the delay unit 910 shown in FIG. 9A or 9B delays the input clock signal $CLK_{IN}$ is the double of a maximum delay time by which the delay unit 110 shown in FIG. 1B delays the input clock signal $CLK_{IN}$.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A delay lock loop, comprising:
   a selection unit receiving a non-inverted clock signal and an inverted clock signal and generating a first clock signal and a second clock signal according to an indication signal;
   a buffer unit coupled to the selection unit and processing an input clock signal to generate the non-inverted clock signal and the inverted clock signal;
   a delay unit coupled to the selection unit, wherein the delay unit comprises a delay factor and delays the first clock signal to generate a third clock signal according to the delay factor; and
   a phase detection unit coupled to the delay unit and the selection unit and generating the indication signal according to a phase difference between the second and third clock signals,
   wherein the delay unit adjusts the delay factor according to the indication signal.

2. The delay lock loop as claimed in claim 1, further comprising:
   a control unit coupled to the phase detection unit and the delay unit, wherein the control unit controls the delay unit such that the delay unit adjusts the delay factor according to the indication signal; and
   a lock unit coupled to the selection unit and the phase detection unit generating a clock signal according to the indication signal, wherein the selection unit receives the lock signal and outputs the first and the second clock signals according to the lock signal.

3. The delay lock loop as claimed in claim 2, wherein the selection unit uses one of the non-inverted clock signal and the inverted clock signal as the first clock signal and uses the other of the non-inverted clock signal and the inverted clock signal as the second clock signal according to the lock signal.

4. The delay lock loop as claimed in claim 3, wherein when a rising edge of the third clock signal leads a falling edge of the second clock signal, the indication signal is at a first level, the clock signal is fixed at the first level, and the selection unit uses the non-inverted clock signal as the first clock signal and uses the inverted clock signal as the second clock signal, and
   when the rising edge of the third clock signal is aligned with a falling edge of the second clock signal, the indication signal is changed from the first level to a second level, the clock signal is fixed at the second level, the level of the lock signal doe not change when the level of the indication signal is changed, and the selection unit uses the inverted clock signal as the first clock signal and uses the non-inverted clock signal as the second clock signal.

5. The delay lock loop as claimed in claim 4, wherein when the rising edge of the third clock signal is aligned with the rising edge of the second clock signal, the control unit directs the delay unit to adjust the delay factor.

6. The delay lock loop as claimed in claim 2, wherein the buffer unit comprises:
   a first buffer processing the input clock signal to generate the non-inverted clock signal; and
   a first inverter inverting the input clock signal to generate the inverted clock signal.

7. A delay lock loop, comprising:
   a selection unit receiving a non-inverted clock signal and an inverted clock signal and generating a first clock signal and a second clock signal according to an indication signal;
   a delay unit coupled to the selection unit, wherein the delay unit comprises a delay factor and delays the first clock signal to generate a third clock signal according to the delay factor; and
   a phase detection unit coupled to the delay unit and the selection unit and generating the indication signal according to a phase difference between the second and third clock signals,
   wherein the delay unit adjusts the delay factor according to the indication signal, wherein the delay unit comprises:
   a first delay circuit delaying the first clock signal to generate a first output signal;
   a second delay circuit coupled to the first delay circuit and delaying the first output signal to generate a second output signal; and
   a first multiplexer receiving the first and second output signals and using the first or second output signal as the third clock signal according to the delay factor.

8. A delay lock loop, comprising:
   a selection unit receiving a non-inverted clock signal and an inverted clock signal and generating a first clock signal and a second clock signal according to an indication signal;
   a delay unit coupled to the selection unit, wherein the delay unit comprises a delay factor and delays the first clock signal to generate a third clock signal according to the delay factor; and
   a phase detection unit coupled to the delay unit and the selection unit and generating the indication signal according to a phase difference between the second and third clock signals,
   wherein the delay unit adjusts the delay factor according to the indication signal, wherein the delay unit comprises:
   a P-type transistor;
   a N-type transistor connected to the P-type transistor in series;

a plurality of pull-high transistors connected in parallel with one another, wherein drains of the pull-high transistors are coupled to a source of the P-type transistor; and a plurality of pull-low transistors connected in parallel with one another, wherein drains of the pull-low transistors are coupled to a source of the N-type transistor.

* * * * *